(12) United States Patent
Huang et al.

(10) Patent No.: US 12,520,702 B2
(45) Date of Patent: Jan. 6, 2026

(54) DISPLAY SUBSTRATE WITH AUXILIARY ELECTRODE PATTERN, DISPLAY APPARATUS AND MANUFACTURING METHOD

(71) Applicants: Chengdu BOE Optoelectronics Technology Co., Ltd., Chengdu (CN); BOE Technology Group Co., Ltd., Beijing (CN)

(72) Inventors: Ao Huang, Beijing (CN); Rui Liu, Beijing (CN); Linlin Wang, Beijing (CN); Sheng Guo, Beijing (CN); Jiandong Bao, Beijing (CN); Weilin Lai, Beijing (CN); Peng Zhou, Beijing (CN); Wenqiang Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 887 days.

(21) Appl. No.: 17/755,262

(22) PCT Filed: Apr. 22, 2021

(86) PCT No.: PCT/CN2021/089065
§ 371 (c)(1),
(2) Date: Apr. 25, 2022

(87) PCT Pub. No.: WO2022/222111
PCT Pub. Date: Oct. 27, 2022

(65) Prior Publication Data
US 2024/0155913 A1    May 9, 2024

(51) Int. Cl.
*H10K 59/80* (2023.01)
*H10K 59/35* (2023.01)
*H10K 71/60* (2023.01)

(52) U.S. Cl.
CPC ..... *H10K 59/80522* (2023.02); *H10K 59/353* (2023.02); *H10K 59/80521* (2023.02);
(Continued)

(58) Field of Classification Search
CPC ............ H10K 71/60; H10K 59/80522; H10K 59/353; H10K 59/80521
See application file for complete search history.

(56) References Cited

U.S. PATENT DOCUMENTS

| 2010/0090589 A1 | 4/2010 | Itagaki et al. |
| 2011/0233576 A1 | 9/2011 | Okutani et al. |

(Continued)

FOREIGN PATENT DOCUMENTS

| CN | 102201431 A | 9/2011 |
| CN | 106098955 A | 11/2016 |

(Continued)

*Primary Examiner* — Suberr L Chi
(74) *Attorney, Agent, or Firm* — Workman Nydegger

(57) ABSTRACT

A display substrate, a display apparatus and a manufacturing method are provided. The display substrate includes: a base substrate; a first electrode layer on a side of the base substrate; a light-emitting layer on a side of the first electrode layer facing away from the base substrate including a plurality of light-emitting portions; a second electrode layer on a side of the light-emitting layer facing away from the first electrode layer; a first transparent inhibitor layer including a plurality of mutually separated first pattern portions; and an auxiliary electrode layer including an auxiliary electrode pattern formed by inhibition of the first pattern portions, where at least part of an orthographic projection of the auxiliary electrode pattern on the base substrate is separated from orthographic projections of the first pattern portions on the base substrate, and the auxiliary electrode pattern is in contact and electrically connected with the second electrode layer.

20 Claims, 26 Drawing Sheets

(52) U.S. Cl.
CPC ............. *H10K 71/60* (2023.02); *H10K 59/80* (2023.02); *H10K 59/874* (2023.02)

(56) References Cited

U.S. PATENT DOCUMENTS

| | | |
|---|---|---|
| 2016/0351636 A1 | 12/2016 | Lee et al. |
| 2018/0233693 A1 | 8/2018 | Li |
| 2022/0037616 A1 | 2/2022 | Liu et al. |
| 2022/0336573 A1 | 10/2022 | Chen et al. |

FOREIGN PATENT DOCUMENTS

| | | |
|---|---|---|
| CN | 106206646 A | 12/2016 |
| CN | 111463360 A | 7/2020 |
| CN | 111584591 A | 8/2020 |
| CN | 111682120 A | 9/2020 |
| CN | 111769210 A | 10/2020 |
| CN | 111864116 A | 10/2020 |
| JP | 2008135325 A | 6/2008 |

--Prior Art--

DISPLAY SUBSTRATE WITH AUXILIARY ELECTRODE PATTERN, DISPLAY APPARATUS AND MANUFACTURING METHOD

CROSS REFERENCE TO RELATED APPLICATIONS

The disclosure is a national phase entry under 35 U.S.C. § 371 of International Application No. PCT/CN2021/089065, filed on Apr. 22, 2021, the entire content of which is incorporated herein by reference.

FIELD

The present disclosure relates to the technical field of semiconductors, in particular to a display substrate, a display apparatus and a manufacturing method.

BACKGROUND

At present, the full surface coverage of cathodes is adopted in mainstream display products. As such, due to the IR Drop, brightness of middles of the display products is greatly decreased compared with a driving side of IC, resulting in poor uniformity of the brightness of the display products. A traditional auxiliary cathode mostly adopts a structure as shown in FIG. 1. A display panel includes: a driving backplane 01, light-emitting devices 06 on one side of the driving backplane 01, a pixel definition layer 02 and an auxiliary cathode 03 located between the adjacent light-emitting devices 06, and a thin film encapsulation layer 05 on one side of the cathode 04 facing away from the light-emitting devices 06. The cathode 04 is in contact and electrically connected with the auxiliary cathode 03, and an auxiliary cathode process is completed on a backplane. However, such traditional auxiliary cathode manufacturing process is complicated, and metal or a metal oxide is generally selected as an auxiliary cathode material. Due to the etching and other processes in the auxiliary cathode manufacturing process, the auxiliary cathode is easily oxidized, so better protection for the backplane is required. Furthermore, after the auxiliary cathode manufacturing process on the backplane is completed, organic substances such as photoresist (PR) are likely to be left on the auxiliary cathode, which will bring contamination between the cathode and the auxiliary cathode, resulting in poor contact.

SUMMARY

Embodiments of the present disclosure provide a display substrate, including:
- a base substrate;
- a first electrode layer, disposed on a side of the base substrate;
- a light-emitting layer, disposed on a side of the first electrode layer facing away from the base substrate, and comprising a plurality of light-emitting portions;
- a second electrode layer, disposed on a side of the light-emitting layer facing away from the first electrode layer;
- a first transparent inhibitor layer, disposed on a side of the second electrode layer facing away from the light-emitting layer, and comprising a plurality of first pattern portions separate from each other; and
- an auxiliary electrode layer, disposed on a side of the first transparent inhibitor layer facing away from the second electrode layer, wherein the auxiliary electrode layer comprises an auxiliary electrode pattern formed by inhibition of the first pattern portions, at least part of an orthographic projection of the auxiliary electrode pattern on the base substrate is separated from orthographic projections of the first pattern portions on the base substrate, and the auxiliary electrode pattern is in contact and electrically connected with the second electrode layer.

In some embodiments, the display substrate has a first display region for arranging a camera component, and a second display region other than the first display region; and the first pattern portions include a plurality of first sub pattern portions located in the second display region, and an orthographic projection of a first sub pattern portion on the base substrate corresponds to in one-to-one correspondence and at least partially overlaps with an orthographic projection of a light-emitting portion in the second display region on the base substrate.

In some embodiments, the first pattern portions further include a second sub pattern portion, and an orthographic projection of the second sub pattern portion on the base substrate and an orthographic projection of the first display region on the base substrate substantially overlap.

In some embodiments, the display substrate further includes a second transparent inhibitor layer between the light-emitting layer and the second electrode layer, wherein the second transparent inhibitor layer comprises second pattern portions located in the first display region; and the second electrode layer covers the second display region and covers a region of the first display region other than the second pattern portion.

In some embodiments, an orthographic projection of each second pattern portion on the base substrate is located at a gap between orthographic projections of adjacent light-emitting portions in the first display region on the base substrate.

In some embodiments, the second pattern portions are of an integrated connection pattern, and orthographic projections of the second pattern portions on the base substrate are complementary to the orthographic projections of the light-emitting portions on the base substrate.

In some embodiments, a distribution of the light-emitting portions in the first display region and a distribution of the light-emitting portions in the second display region are same; and the second pattern portions are of a separately-distributed pattern, and located in gaps between adjacent pixel rows.

In some embodiments, a distribution density of the light-emitting portions in the first display region is smaller than a distribution density of the light-emitting portions in the second display region; and the first display region includes: a first pixel row and a second pixel row arranged alternately, the first pixel row includes a blue light-emitting portion that emits blue light and a red light-emitting portion that emits red light, the second pixel row includes a green light-emitting portion that emits green light, and a center line of the green light-emitting portion perpendicular to a pixel row direction is located between a center line of the blue light-emitting portion perpendicular to the pixel row direction and a center line of the red light-emitting portion perpendicular to the pixel row direction; and the second pattern portions are of a separately-distributed pattern, and are located at gaps between adjacent green light-emitting portions of the second pixel row.

In some embodiments, a distribution density of the light-emitting portions in the first display region is smaller than a distribution density of the light-emitting portions in the second display region; and the first display region includes: a third pixel row and a fourth pixel row disposed alternately, the third pixel row includes a blue light-emitting portion that emits blue light and a green light-emitting portion that emits green light, the fourth pixel row includes a red light-emitting portion that emits red light, and a center line of the red light-emitting portion perpendicular to a pixel row direction is located between a center line of the blue light-emitting portion perpendicular to the pixel row direction and a center line of the green light-emitting portion perpendicular to the pixel row direction; and the second pattern portions are of a separately-distributed pattern, and located at gaps between adjacent red light-emitting portions of the fourth pixel row.

In some embodiments, a shape of the second pattern portion is a circle or a hexagon.

In some embodiments, the first transparent inhibitor layer and the second transparent inhibitor layer are made of the same material.

In some embodiments, the first transparent inhibitor layer includes one or a combination of the following:
fluorine-containing silane and derivatives;
fatty acid and derivatives;
thiol and derivatives;
sulfide and derivatives;
hydroxyl-group-containing molecules and derivatives; or
phosphate-group-containing molecules and derivatives.

In some embodiments, the first transparent inhibitor layer and the auxiliary electrode layer have different surface energies.

In some embodiments, a transmittance of the first transparent inhibitor layer is higher than a transmittance of the second electrode layer.

In some embodiments, a material of the second electrode layer is the same as a material of the auxiliary electrode layer; and the material of the second electrode layer includes: magnesium, silver or magnesium-silver alloy.

In some embodiments, an encapsulation layer is provided on the side of the auxiliary electrode layer facing away from the first inhibitor layer.

An embodiment of the present disclosure further provides a display apparatus, including the display substrate provided by the embodiment of the present disclosure.

In some embodiments, the display substrate has a first display region for arranging a camera component, and a second display region other than the first display region; and the display apparatus further includes: a camera component located in the first display region.

Embodiments of the present disclosure provide a manufacturing method of a display substrate, including:
providing a base substrate;
forming a first electrode layer on a side of the base substrate;
forming a light-emitting layer with a plurality of light-emitting portions on a side of the first electrode layer facing away from the base substrate;
forming a second electrode layer on a side of the light-emitting layer facing away from the first electrode layer;
forming a first transparent inhibitor layer having a plurality of mutually separated first pattern portions on a side of the second electrode layer facing away from the light-emitting layer through shielding of a mask by adopting an evaporation process; and
evaporating an auxiliary electrode material on a side of the first transparent inhibitor layer facing away from the second electrode layer, wherein the first pattern portions inhibit deposition of the auxiliary cathode material, so that the auxiliary electrode material is formed in a region other than the first pattern portions and is in contact and electrically connected with the second electrode layer.

In some embodiments, the display substrate has a first display region for arranging a camera component, and a second display region other than the first display region; and
the evaporating and forming the first transparent inhibitor layer having the plurality of first pattern portions on one side of the second electrode layer facing away from the light-emitting layer through shielding of the mask by adopting the evaporation process, includes:
forming a plurality of first sub pattern portions located in the second display region on the side of the second electrode layer facing away from the light-emitting layer through shielding of a first mask by adopting the evaporation process, wherein the first mask has first hollow parts in one-to-one correspondence to patterns of the light-emitting portions in the second display region; and
forming a second sub pattern portion located in the first display region on the side of the second electrode layer facing away from the light-emitting layer through shielding of a second mask by adopting the evaporation process, wherein the second mask has a second hollow part corresponding to the first display region.

In some embodiments, the display substrate has a first display region for arranging a camera component, and a second display region other than the first display region; and
the evaporating and forming the first transparent inhibitor layer having the plurality of first pattern portions on one side of the second electrode layer facing away from the light-emitting layer through shielding of the mask by adopting the evaporation process, includes:
evaporating and forming a first transparent inhibitor layer having a plurality of first sub pattern portions and a second sub pattern portion on one side of the second electrode layer facing away from the light-emitting layer through shielding of a third mask by adopting the evaporation process, wherein the third mask has first hollow parts in one-to-one correspondence to patterns of the light-emitting portions in the second display region and has a second hollow part corresponding to the first display region.

In some embodiments, after forming the light-emitting layer on the side of the first electrode layer facing away from the base substrate, and before forming the second electrode layer on the side of the light-emitting layer facing away from the first electrode layer, the manufacturing method further includes: forming a second transparent inhibitor layer having a plurality of second pattern portions on the side of the light-emitting layer facing away from the first electrode layer through shielding of a fourth mask by adopting the evaporation process; and
the forming the second electrode layer on one side of the light-emitting layer facing away from the first electrode layer includes: evaporating a second electrode material on the side of the light-emitting layer facing away from the first electrode layer, where deposition of the second electrode material is inhibited by the second pattern portions, so that the second electrode material is formed in a region other than the second pattern portions.

DETAILED DESCRIPTION

In order to make the objective, technical solutions and advantages of the embodiments of the present disclosure more clear, the technical solutions of the embodiments of the present disclosure will be described clearly and completely with reference to drawings of the embodiments of the present disclosure. Obviously, the described embodiments are part of the embodiments of the present disclosure, but not all the embodiments. On the basis of the described embodiments of the present disclosure, all other embodiments obtained by those ordinarily skilled in the art without inventive efforts fall within the protection scope of the present disclosure.

Unless otherwise defined, technical or scientific terms used in the present disclosure shall have usual meanings understood by a person of ordinary skill in the art to which the present disclosure belongs. The words "first", "second" and the like used in the present disclosure do not indicate any order, quantity or importance, but are only used to distinguish different components. The word "including" or "containing" and the like, means that an element or item preceding the word covers an element or item listed after the word and the equivalent thereof, without excluding other elements or items. The word "connection" or "coupling" and the like is not restricted to physical or mechanical connection, but may include electrical connection, whether direct or indirect. The words "up", "down", "left", "right" and the like are only configured to indicate a relative positional relationship. When the absolute position of a described object changes, the relative positional relationship may also change accordingly.

In order to keep the following description of the embodiments of the present disclosure clear and concise, the present disclosure omits detailed descriptions of well-known functions and well-known components.

Figure 1:
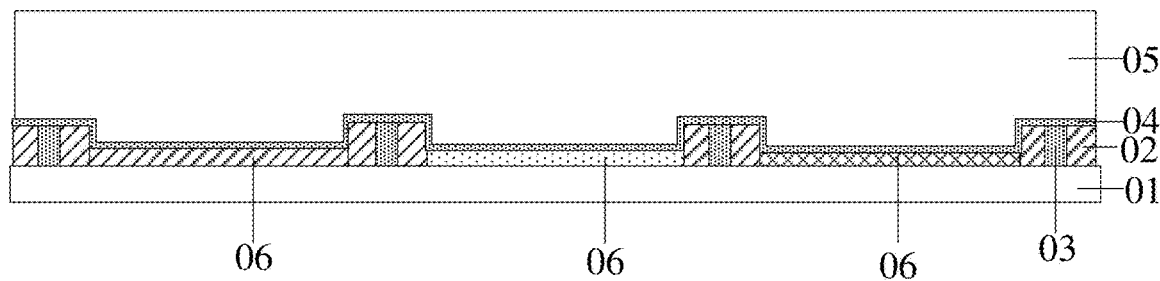
FIG. 1 is a schematic structural diagram of a display substrate in the prior art.
Figure 2:
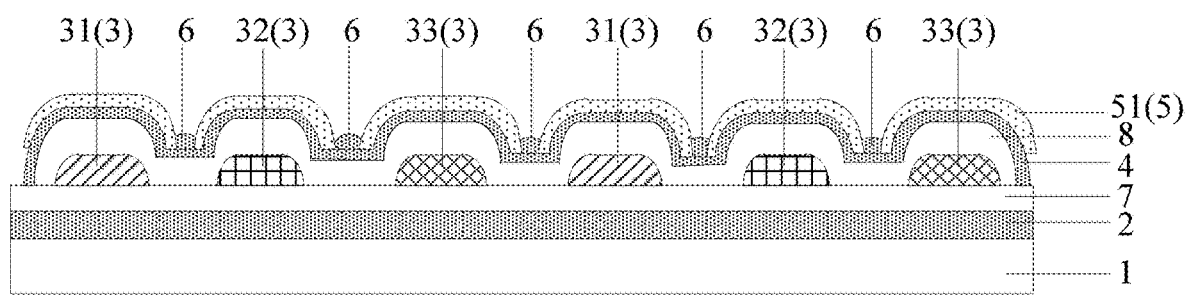
FIG. 2 is a first schematic sectional view of a display substrate according to an embodiment of the present disclosure.
Figure 3:
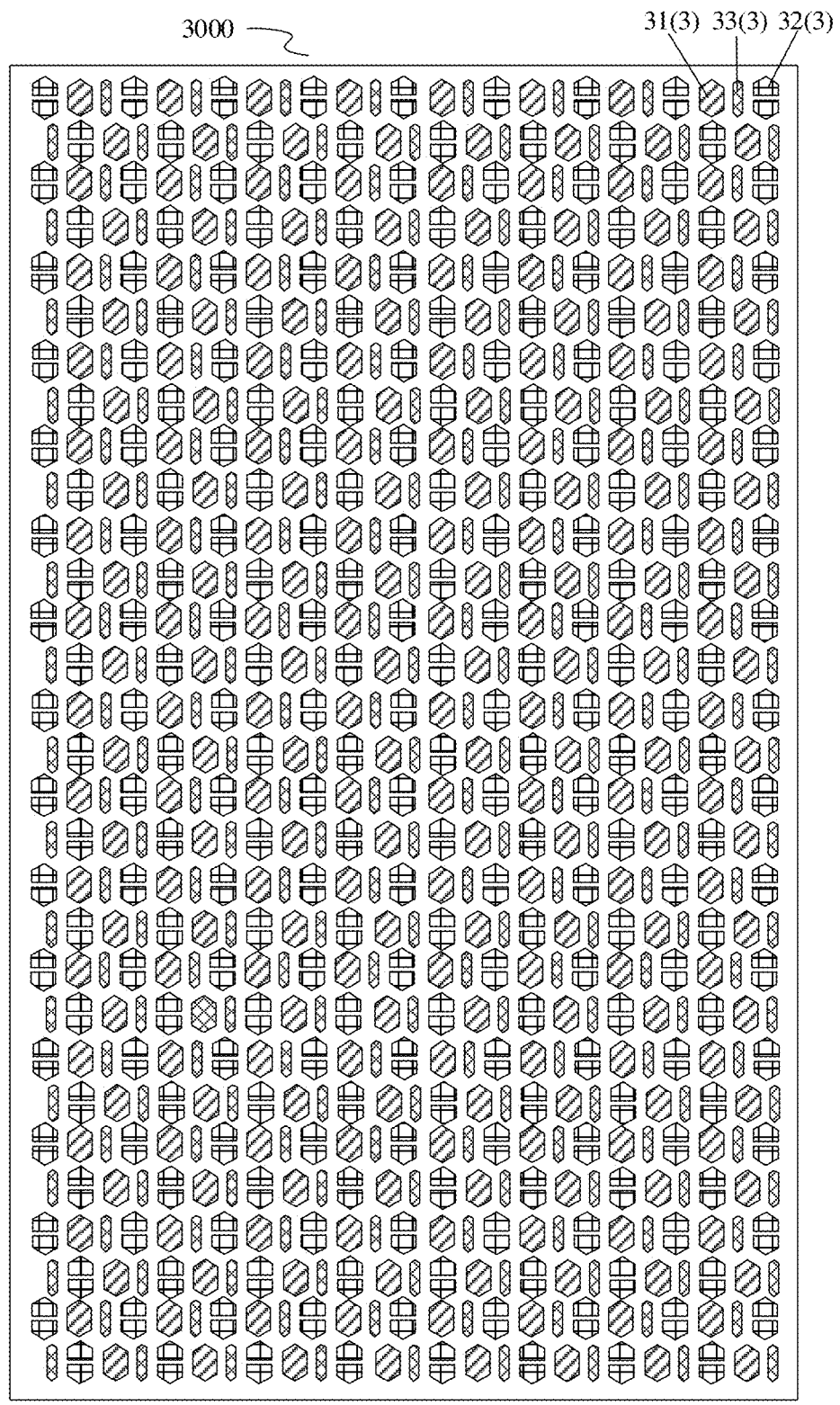
FIG. 3 is a first schematic top view of a light-emitting layer according to an embodiment of the present disclosure.
Figure 4:
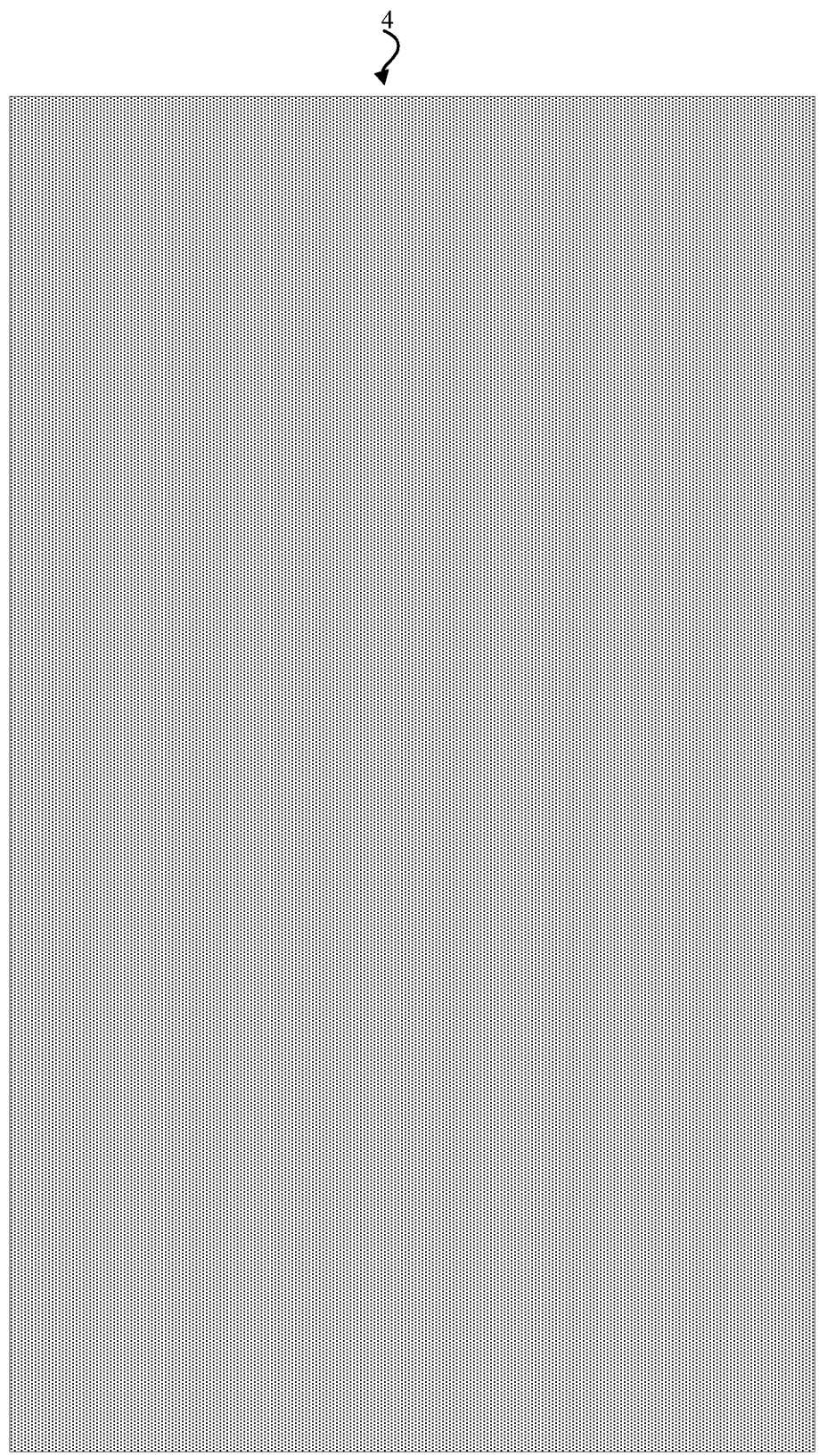
FIG. 4 is a first schematic top view of a second electrode layer according to an embodiment of the present disclosure.
Figure 5:
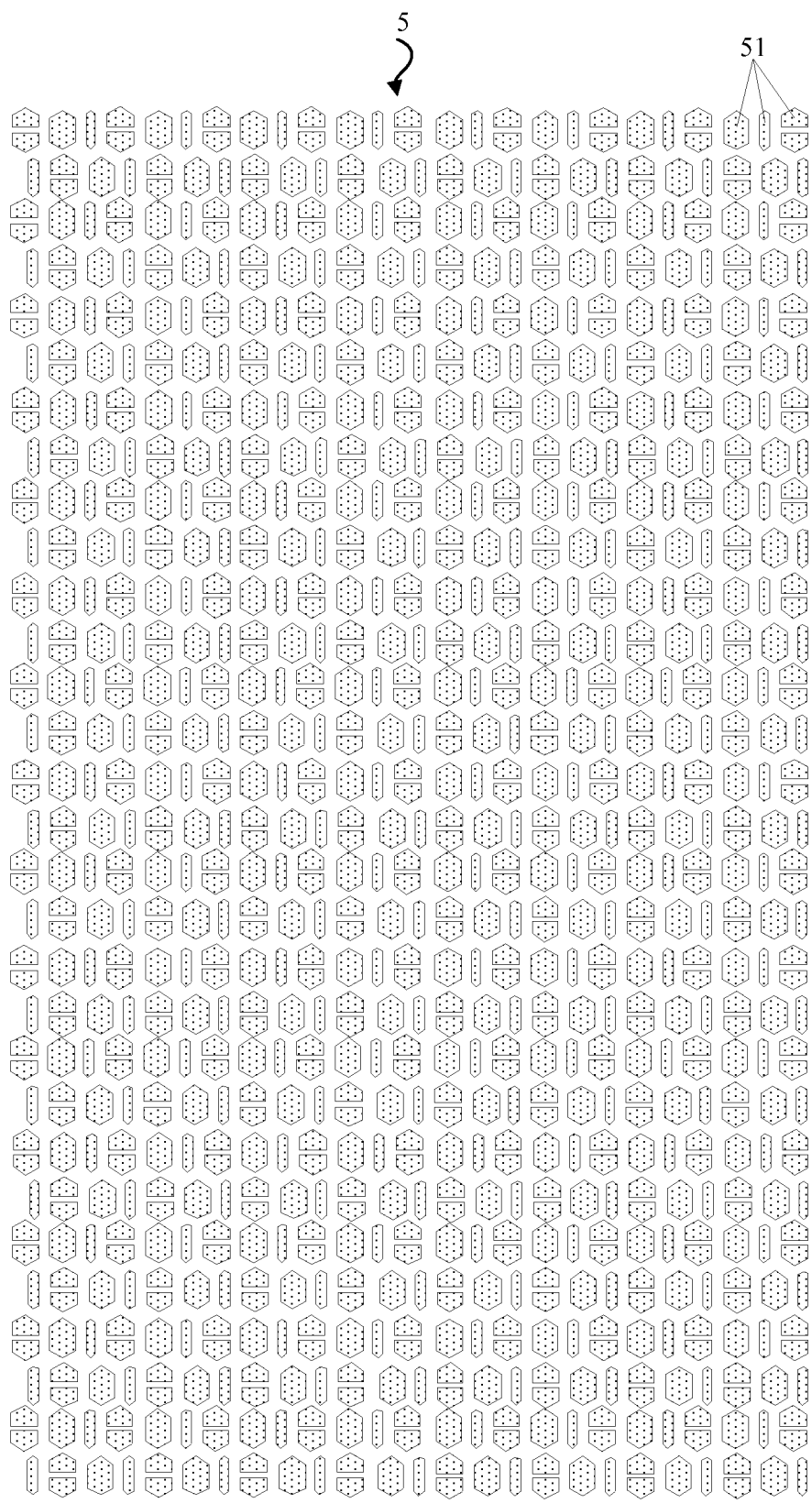
FIG. 5 is a first schematic top view of a first inhibitor layer according to an embodiment of the present disclosure.
Figure 6:
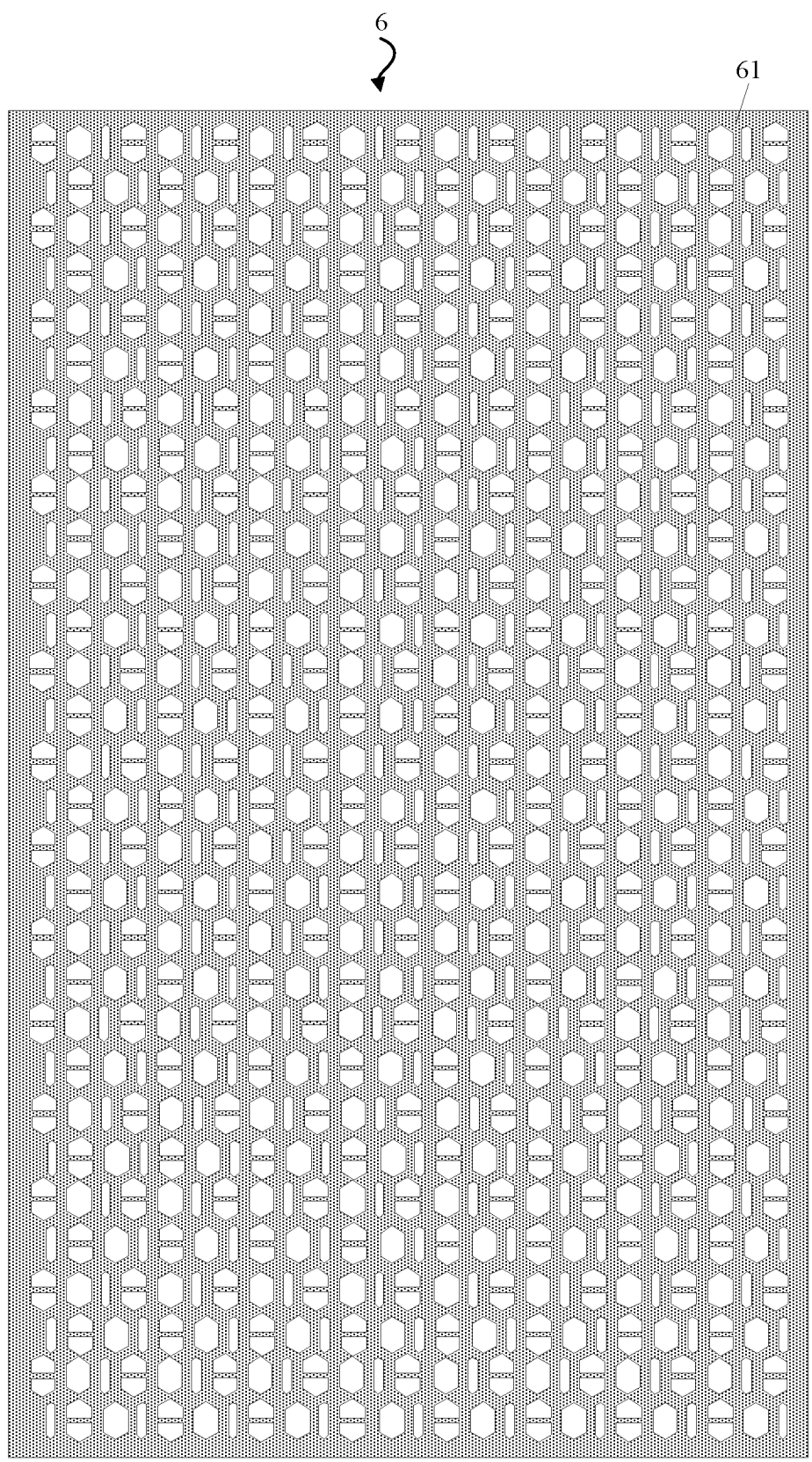
FIG. 6 is a first schematic top view of an auxiliary electrode layer according to an embodiment of the present disclosure.
Figure 7:
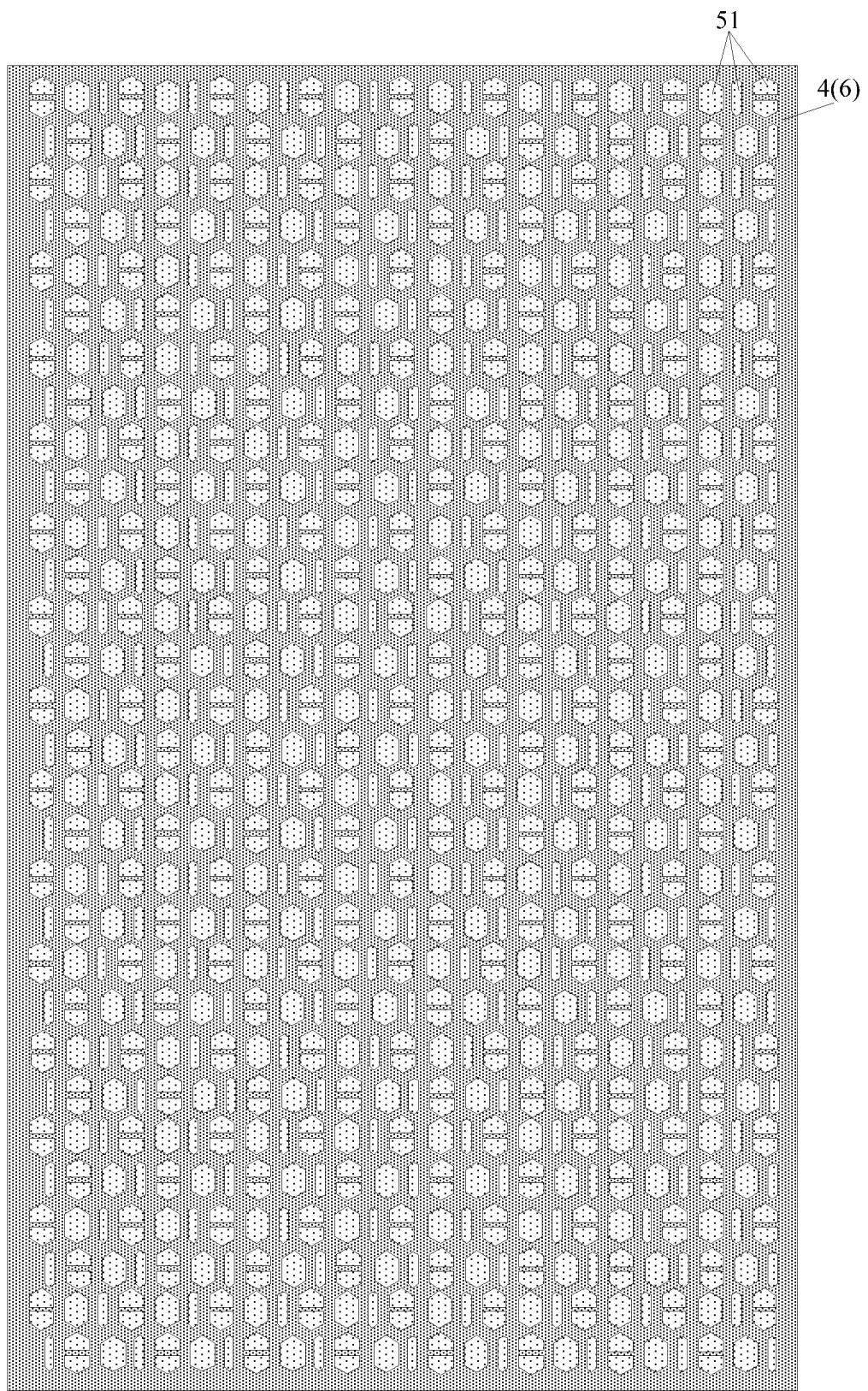
FIG. 7 is a first schematic top view of a structure including a second electrode layer, a first inhibitor layer and an auxiliary electrode layer according to an embodiment of the present disclosure.

Embodiments of the present disclosure provide a display substrate, as shown in FIGS. 2-7. Here FIG. 3 shows a schematic top view of a light-emitting layer 3000, FIG. 4 shows a schematic top view of a second electrode layer, FIG. 5 shows a schematic top view of a first inhibitor layer, FIG. 6 shows a schematic top view of an auxiliary electrode layer, and FIG. 7 is a schematic top view of a structure with a second electrode layer, a first inhibitor layer and an auxiliary cathode layer stacked. The display substrate includes:

a base substrate 1;

a first electrode layer 2 on a side of the base substrate 1;

a light-emitting layer 3000 on a side of the first electrode layer 2 facing away from the base substrate 1, including a plurality of light-emitting portions 3; in some embodiments, the light-emitting portion 3 may be a blue light-emitting portion 31 that emits blue light, or a green light-emitting portion 32 that emits green light, or a red light-emitting portion 33 that emits red light;

a second electrode layer 4 on a side of the light-emitting layer 3000 facing away from the first electrode layer 2;

a first transparent inhibitor layer 5, on a side of the second electrode layer 4 facing away from the light-emitting layer 3000, and including a plurality of first pattern portions 51 separate from each other; and an auxiliary electrode layer 6 on a side of the first transparent inhibitor layer 5 facing away from the second electrode layer 4; here the auxiliary electrode layer 6 includes an auxiliary electrode pattern 61 formed by inhibition of the first pattern portions 51, at least part of an orthographic projection of the auxiliary electrode pattern 61 on the base substrate 1 is separated from orthographic projections of the first pattern portions 51 on the base substrate 1, and the auxiliary electrode pattern 61 is in contact and electrically connected with the second electrode layer 4. Specifically, the auxiliary electrode pattern 61 may cover a region other than the first pattern portions 51, and is in contact and electrically connected with the second electrode layer 4 at the region other than the first pattern portions 51.

In the embodiment of the present disclosure, the first transparent inhibitor layer is disposed on a side of the second electrode layer facing away from the light-emitting layer 3000, and the first transparent inhibitor layer has the plurality of first pattern portions. Due to an inhibitory effect of the first transparent inhibitor layer, formation of the auxiliary electrode layer may be inhibited in a region where the first pattern portions are formed, so that at least part of the orthographic projection of the auxiliary electrode pattern on the base substrate is separated from the orthographic projections of the first pattern portions on the base substrate, and the auxiliary electrode pattern and the second electrode layer are in contact and electrically connected to realize manufacturing of a patterned auxiliary electrode layer, which improves a problem of uneven brightness of the display substrate caused by IR drop. Moreover, compared with a patterned auxiliary electrode layer in the prior art, the embodiment of the present disclosure does not need etching and other processes, the auxiliary electrode layer is not prone to being oxidized, which can reduce the cost for better protection of a backplane, and there will be no organic residues such as photoresist, so that a problem of poor contact between the second electrode layer and the auxiliary electrode layer due to the presence of pollutants may be improved.

During specific implementation, a first functional layer 7 may further be disposed between the first electrode layer 2 and the light-emitting layer 3000, and a second functional layer 8 may further be disposed between the second electrode layer 4 and the light-emitting layer 3000. Specifically, taking an example that the display substrate is of an upright structure, the first electrode layer 2 may be an anode layer, the second electrode layer 4 may be a cathode layer, the first functional layer 7 may be a hole transport layer, and the second functional layer 8 may be an electron transport layer.

In some embodiments, the first pattern portions 51 may be distributed on the display substrate on a full surface, and only include portions with shapes whose orthographic projection on the base substrate 1 and orthographic projections of the light-emitting portions 3 on the base substrate 1 overlap in one-to-one correspondence, with reference to FIGS. 2-7.

Figure 8:
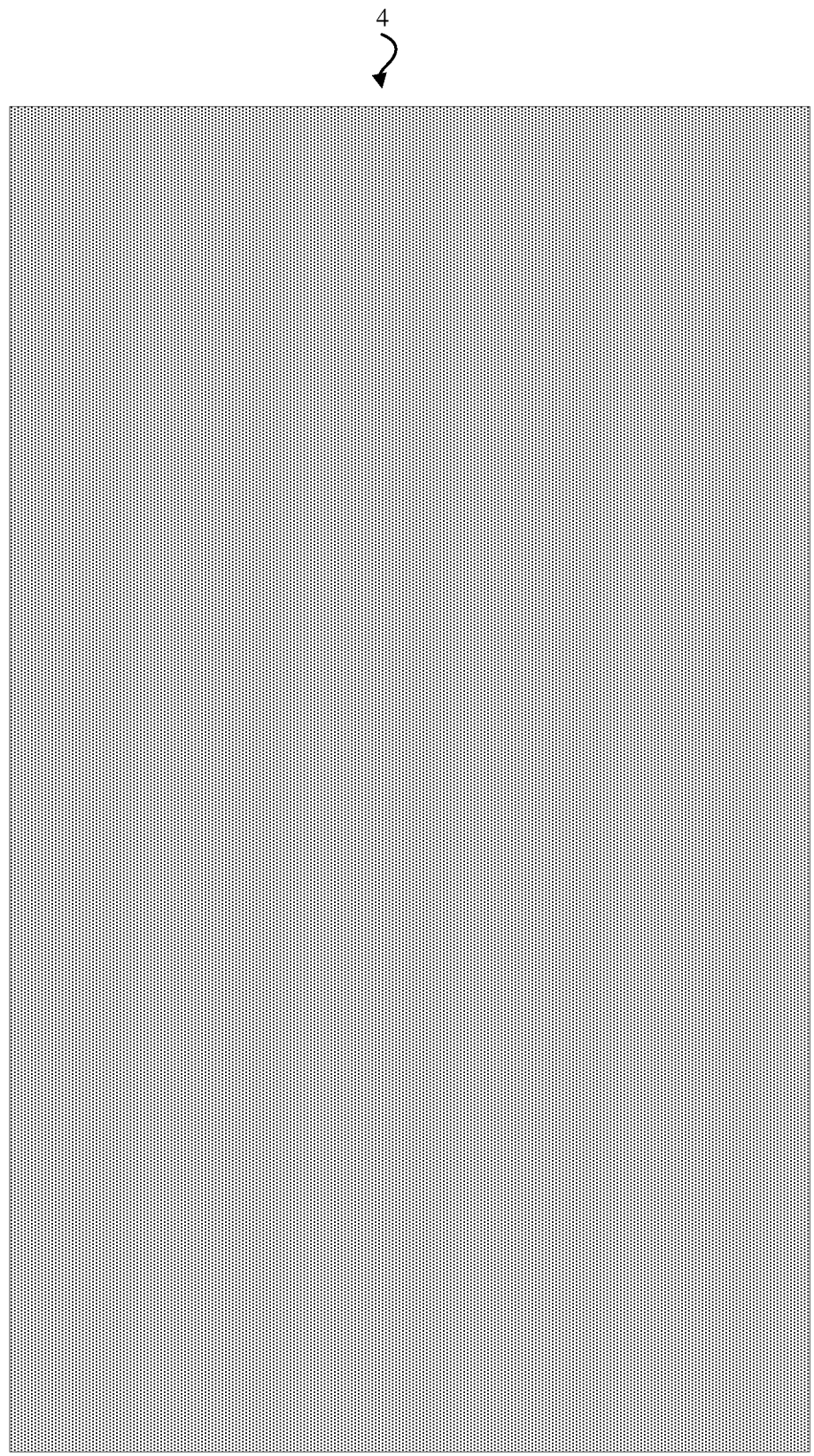
FIG. 8 is a second schematic top view of a second electrode layer according to an embodiment of the present disclosure.
Figure 9:
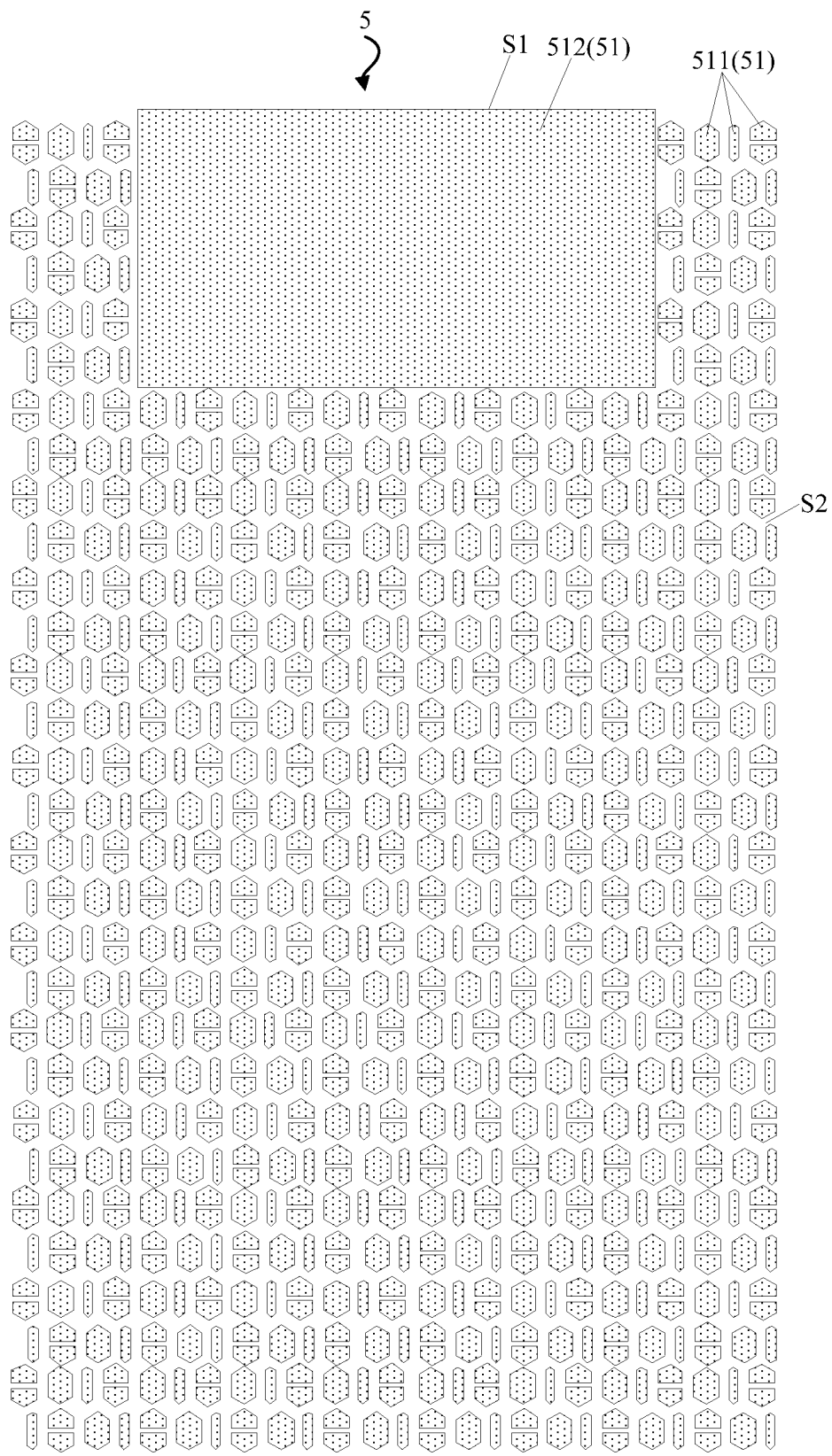
FIG. 9 is a second schematic top view of a first inhibitor layer according to an embodiment of the present disclosure.
Figure 10:
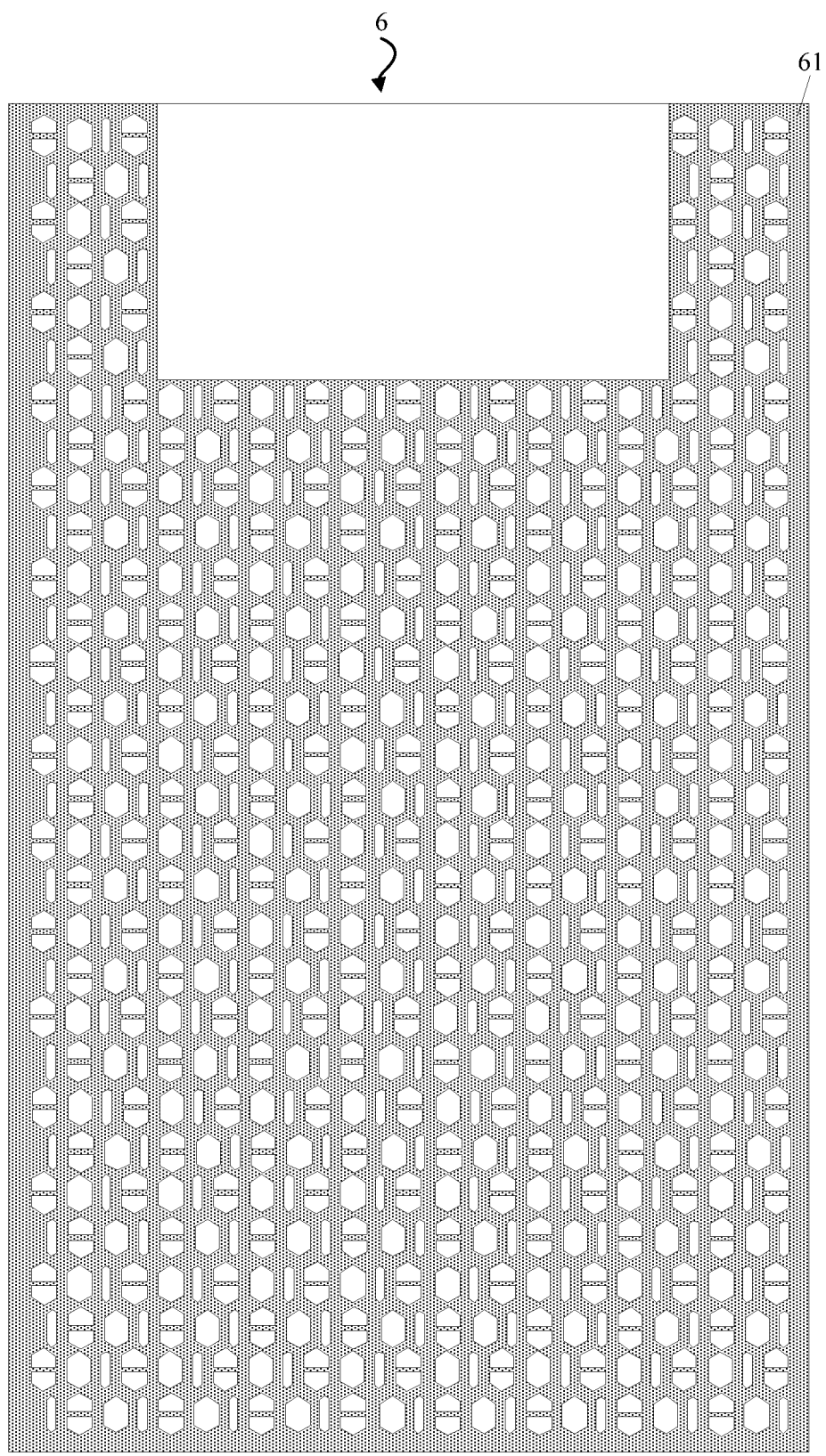
FIG. 10 is a second schematic top view of an auxiliary electrode layer according to an embodiment of the present disclosure.
Figure 11:
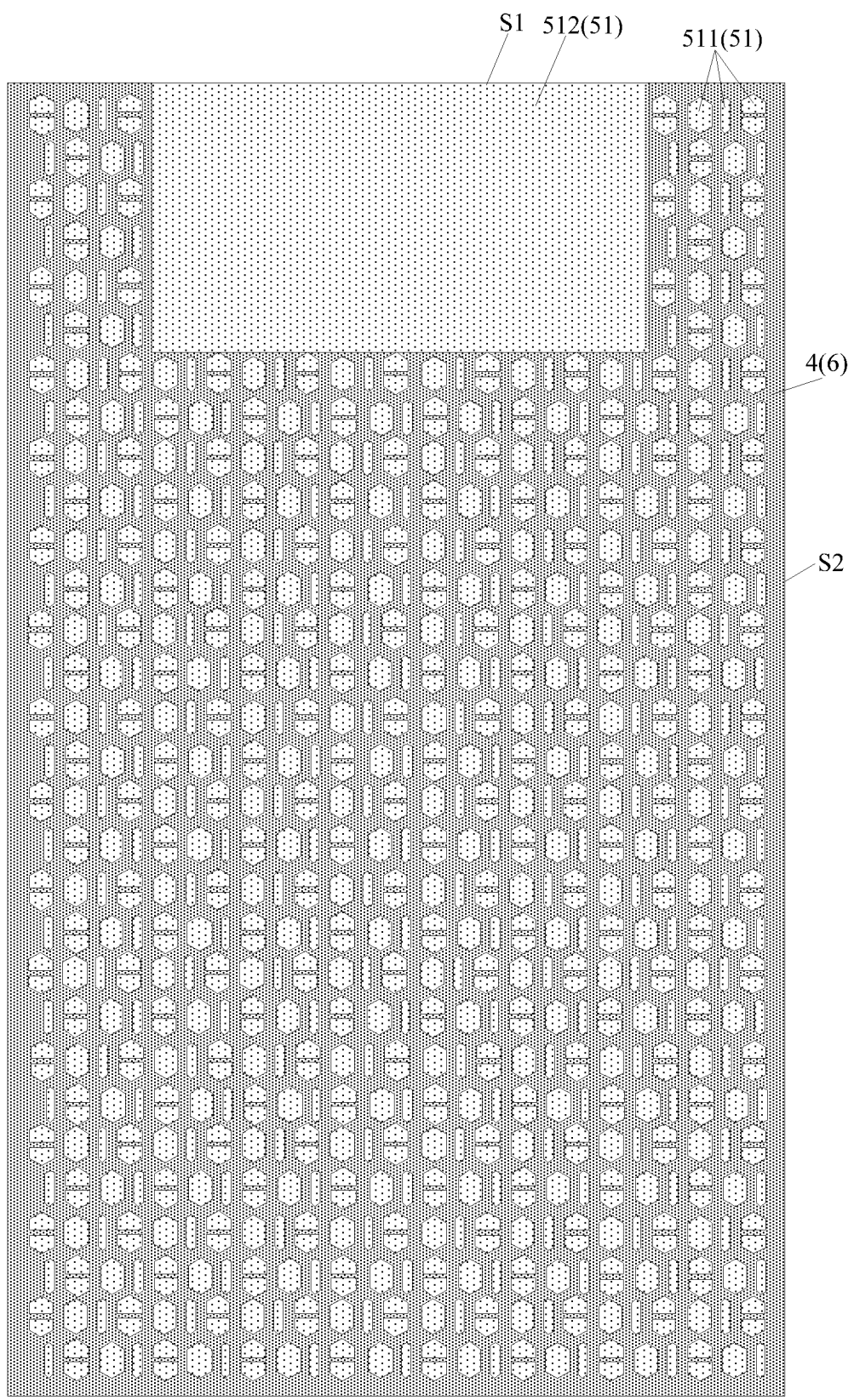
FIG. 11 is a second schematic top view of a structure including a second electrode layer, a first inhibitor layer and an auxiliary electrode layer according to an embodiment of the present disclosure.
Figure 12:
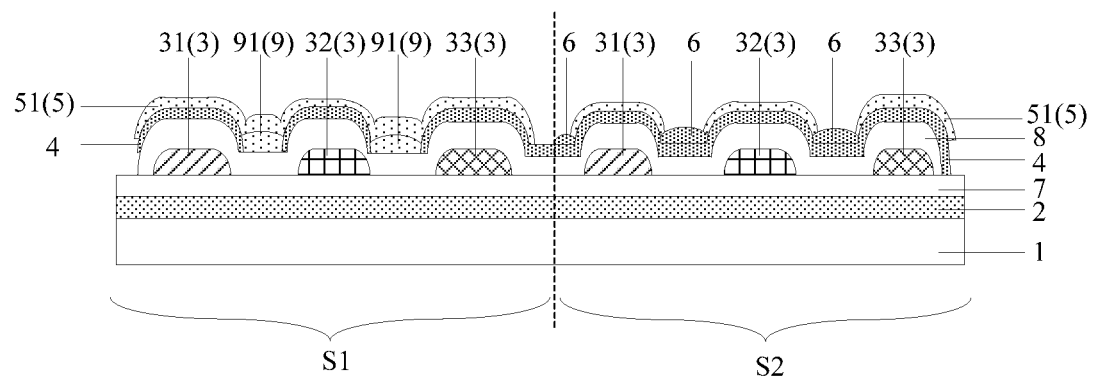
FIG. 12 is a second schematic sectional view of a display substrate according to an embodiment of the present disclosure.

In some embodiments, the first pattern portions 51 may also include a pattern correspondingly overlapped with the light-emitting portions 3, and include other shapes, as shown in FIG. 8, FIG. 9, FIG. 10 and FIG. 11. FIG. 8 shows a schematic top view of the second electrode layer, FIG. 9 shows a schematic top view of the first inhibitor layer, FIG. 10 shows a schematic top view of the auxiliary electrode layer, FIG. 11 shows a schematic top view of a structure with the second electrode layer, the first inhibitor layer and the auxiliary cathode layer stacked. The display substrate has a first display region S1 for arranging a camera component, and a second display region S2 other than the first display region S1. The first pattern portions 51 may include a plurality of first sub pattern portions 511 located in the second display region S2, and orthographic projections of the first sub pattern portions 511 on the base substrate 1 and orthographic projection of the light-emitting portions 3 of the second display region S2 on the base substrate 1 are in one-to-one correspondence and at least partially overlap with each other respectively. The first pattern portions 51 further include a second sub pattern portion 512, and the orthographic projection of the second sub pattern portion 512 on the base substrate 1 and an orthographic projection of the first display region S1 on the base substrate 1 substantially overlap. Specifically, due to actual process error, the process difficulty is large if requiring the orthographic projection of the second sub pattern portion 512 on the base substrate 1 and the orthographic projection of the first display region S1 on the base substrate 1 completely overlap. Therefore, in the embodiment of the present disclosure, the orthographic projection of the second sub pattern portion 512 on the base substrate 1 and the orthographic projection of the first display region S1 on the base substrate 1 roughly overlap, which may be understood as the overlap within an allowable scope of the process error. In the embodiment of the present disclosure, the first pattern portions 51 include first sub pattern portions 511 located in the second display region S2 (a region other than a region a camera part is disposed), and the second sub pattern portions 512 located in the first display region S1 (the region where the camera component is disposed), and the orthographic projection of the second sub pattern portion 512 on the base substrate 1 and the orthographic projection of the first display region S1 on the base substrate 1 roughly overlap, thereby inhibiting formation of the auxiliary electrode layer 6 in the first display region S1, improving the transmittance of the first display region S1, and being beneficial for the camera component to obtain light.

Figure 13A:
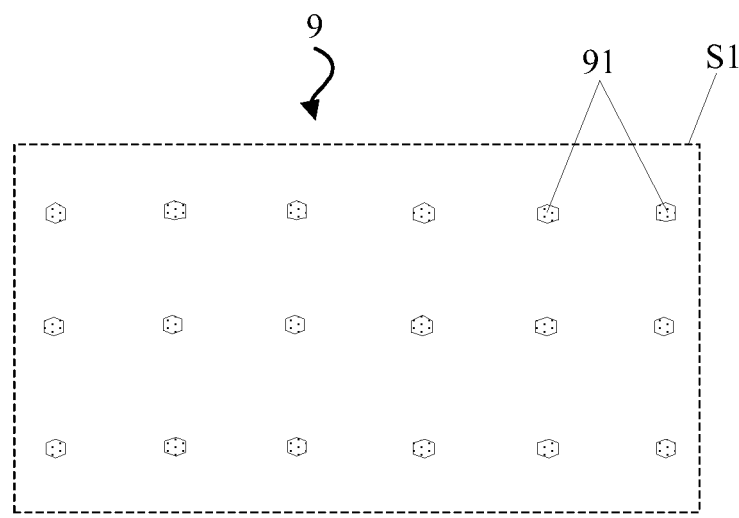
FIG. 13A is a first schematic top view of a pattern of a second inhibitor layer according to an embodiment of the present disclosure.
Figure 14:
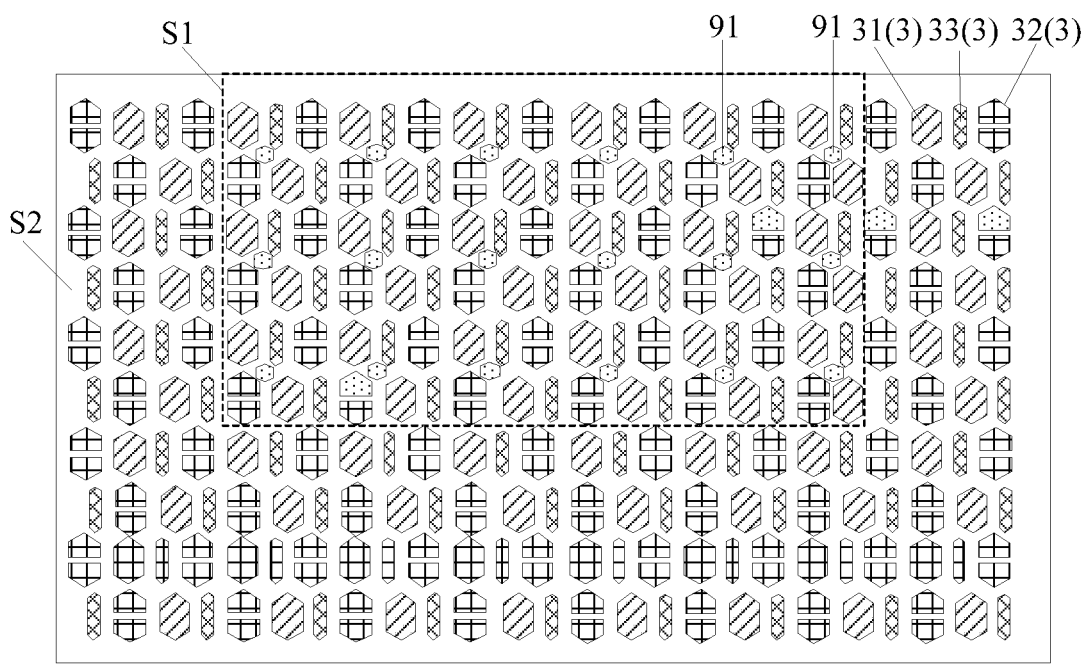
FIG. 14 is a first schematic top view showing a second inhibitor layer and a light-emitting layer pattern according to an embodiment of the present disclosure.
Figure 15:
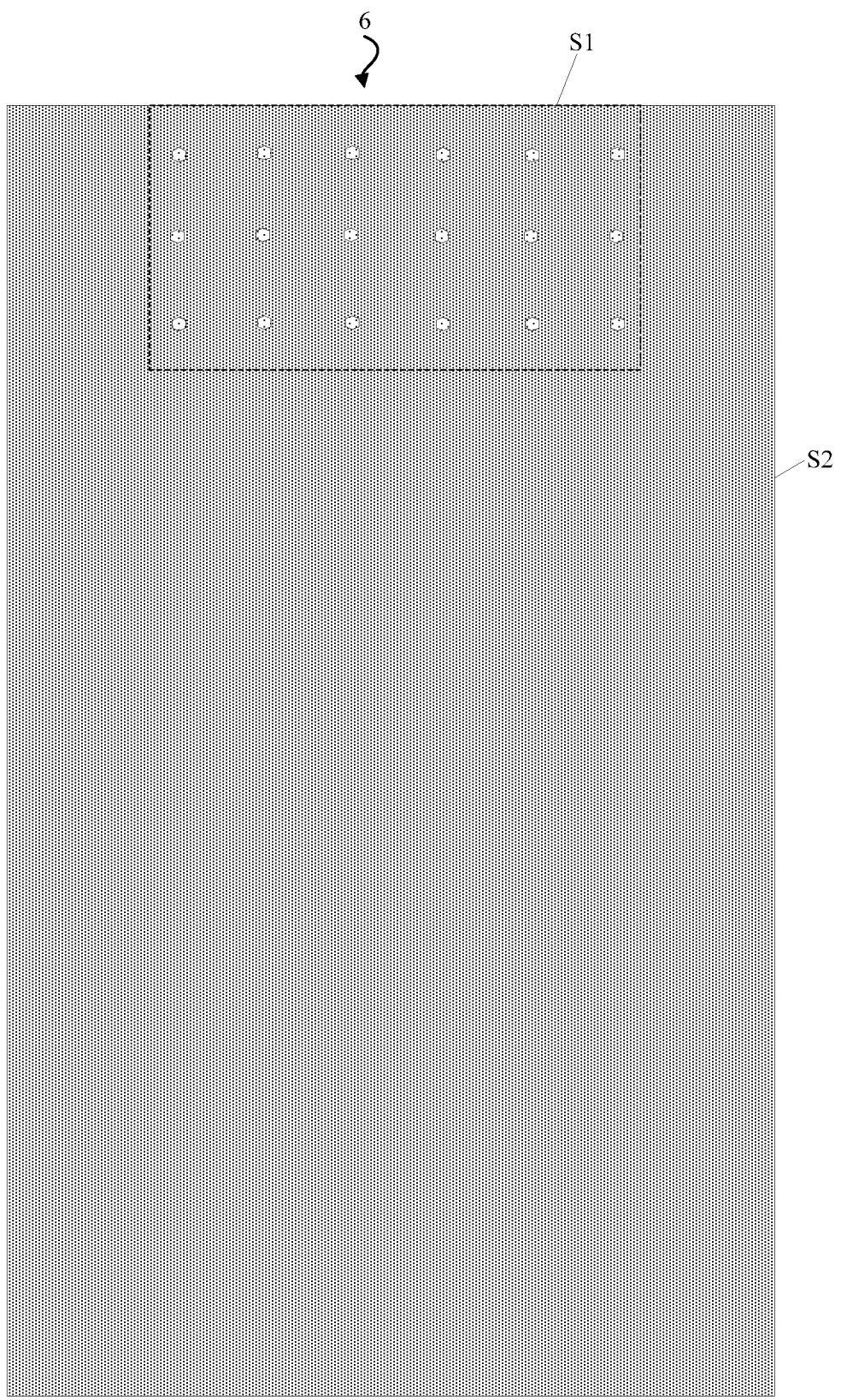
FIG. 15 is a third schematic top view of a second electrode layer according to an embodiment of the present disclosure.

In some embodiments, the display substrate further includes a second transparent inhibitor layer 9 located between the light-emitting layer 3000 and the second electrode layer 4, as shown in FIG. 12, FIG. 13A, FIG. 14 and FIG. 15. FIG. 13A shows a schematic top view of the second transparent inhibitor layer 9, FIG. 14 shows a partial enlarged schematic top view of a structure with the second transparent inhibitor layer 9 and the light-emitting layer 3000 stacked, and FIG. 15 shows a schematic view of the auxiliary electrode layer 6. The second transparent inhibitor layer 9 includes a second pattern portion 91 located in the first display region S1. The second electrode layer 4 covers the second display region S2 and covers a region of the first display region S1 other than the second pattern portion 91. In the embodiment of the present disclosure, the display substrate further includes a second transparent inhibitor layer 9 located between the light-emitting layer 3000 and the second electrode layer 4, and the second transparent inhibitor layer 9 includes a plurality of second pattern portions 91 located in the first display region S1. Due to an inhibiting effect of the second pattern portions 91, the second electrode layer 4 may be formed in a region other than the second pattern portions 91, so that patterning of the second electrode layer 4 in the first display region S1 may be realized, which further improves the transmittance of the first display region S1 and is beneficial for the camera component to obtain light.

When the display substrate further includes the second transparent inhibitor layer 9, a pattern of the first transparent inhibitor layer 5 may be as shown in FIG. 9, and a pattern of the auxiliary electrode layer 6 may be as shown in FIG. 10.

During specific implementation, the second pattern portions 91 may be separated patterns. In some embodiments, with reference to FIG. 12 and FIG. 14, orthographic projections of the second pattern portions 91 on the base substrate 1 are located at a gap between the orthographic projections of the adjacent light-emitting portions 3 in the first display region S1 on the base substrate 1. In the embodiment of the present disclosure, the orthographic projections of the second pattern portions 91 on the base substrate 1 are located at the gap between the orthographic projections of the adjacent light-emitting portions 3 in the first display region S1 on the base substrate 1, so that the second electrode layer 4 is formed in a region where the light-emitting portions 3 are located. Influence on the light emission of the light-emitting portions 3 in the first display region S1 may be avoided under the condition of improving the light transmittance of the first display region S1.

Specifically, shapes of the separated second pattern portions 91 may be a circle or a hexagon.

During specific implementation, when the second pattern portions 91 are the separated patterns, the distribution and shapes of the light-emitting portions 3 in the first display region S1 may be the same as the distribution and shapes of the light-emitting portions 3 in the second display region S2. As shown in FIG. 14, the second pattern portions 91 may be disposed in a region between adjacent pixels of the first display region S1. In this way, the display substrate may also have a high display resolution when being displayed in the first display region S1.

Figure 16A:
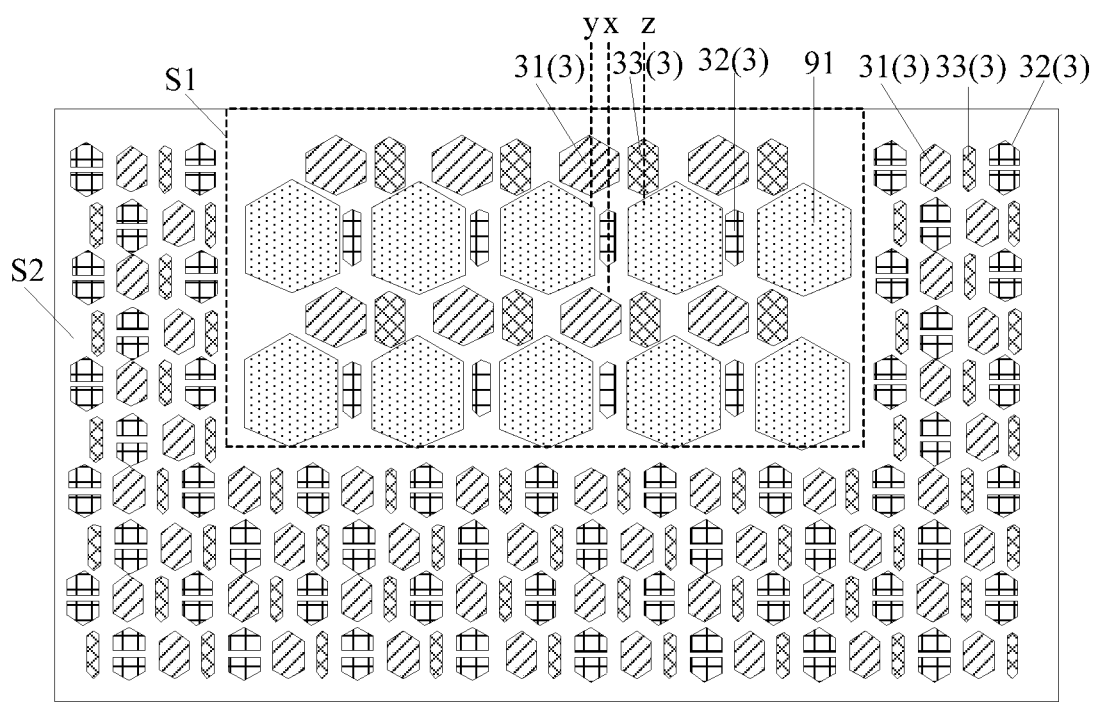
FIG. 16A is a second schematic top view showing a second inhibitor layer pattern and a light-emitting layer pattern according to an embodiment of the present disclosure.

In some embodiments, when the second pattern portions 91 are the separated patterns, the distribution and shapes of the light-emitting portions 3 in the first display region S1 may also be different from the distribution and shapes of the light-emitting portions 3 in the second display region S2. As shown in FIG. 16A, a distribution density of the light-emitting portions 3 in the first display region S1 may be made smaller than a distribution density of the light-emitting portions 3 in the second display region S2, a spacing between the light-emitting portions 3 in the first display region S1 is greater than a spacing between the light-emitting portions 3 in the second display region S2, and a size of the light-emitting portions 3 in the first display region S1 is greater than a size of the corresponding light-emitting portions 3 in the second display region S2. Specifically, for example, the distribution of the light-emitting portions 3 in the first display region S1 may be: the first display region S1 includes a first pixel row and a second pixel row alternately arranged, and the first pixel row includes a sequentially and periodically arranged blue light-emitting portion 31 that emits blue light, and red light-emitting portions 33 that emits red light; the second pixel row includes a green light-emitting portion 32 that emits green light. A center line x of the green light-emitting portion 32 perpendicular to a pixel row direction is located between a center line y of the blue light-emitting portion 31 perpendicular to the pixel row direction and a center line z of the red light-emitting portion 33 perpendicular to the pixel row direction. Orthographic projection shapes of the blue light-emitting portions 31, the red light-emitting portions 33 and the green light-emitting portions 32 on the base substrate 1 may all be hexagonal, a width of the blue light-emitting portion 31 in a direction parallel to the pixel row is greater than a width of the red light-emitting portion 33 in the direction parallel to the pixel row, and the width of the red light-emitting portion 33 in the direction parallel to the pixel row is greater than the width of the green light-emitting portion 32 in the direction parallel to the pixel row. The second pattern portions 91 may be disposed at a gap between the adjacent green light-emitting portions 32 of the second pixel row. In this way, the display substrate may have a high transmittance in the first display region S1, which is beneficial for the camera component to obtain light.

Figure 16B:
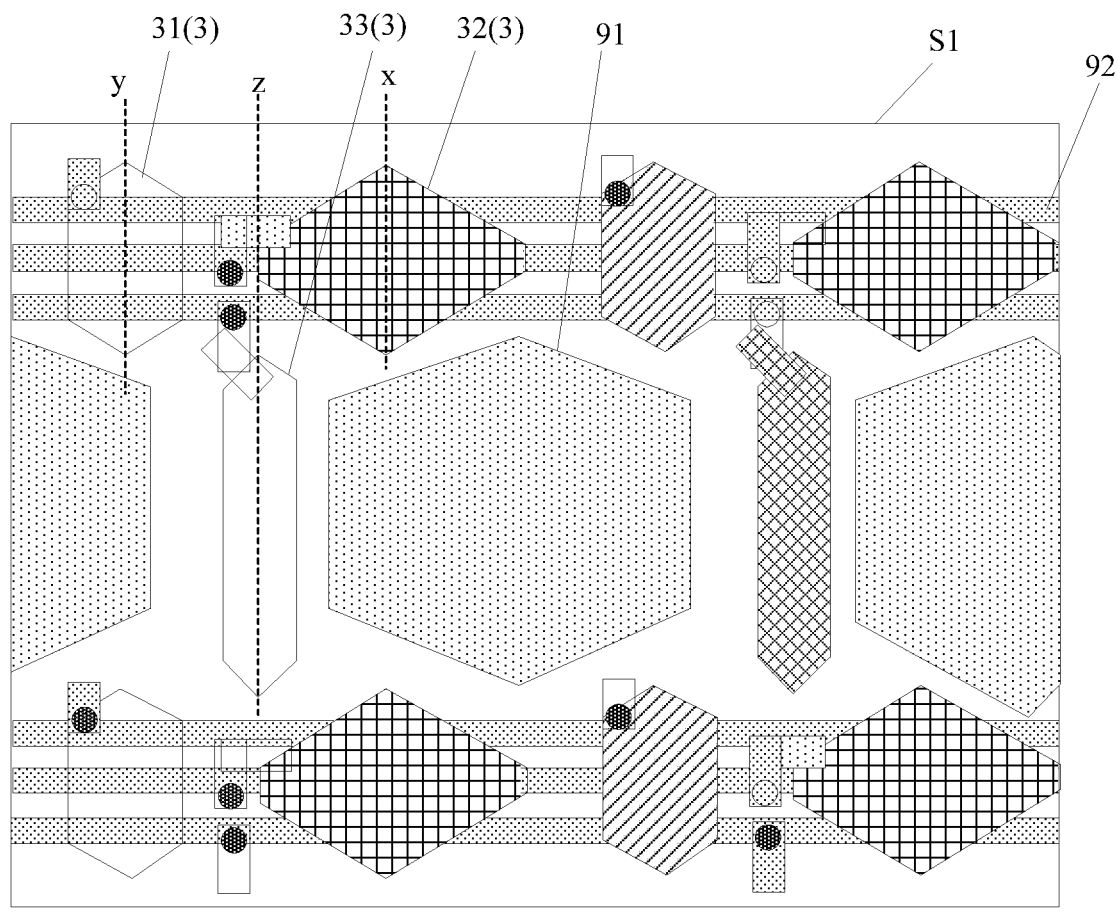
FIG. 16B is a third schematic top view showing a second inhibitor layer pattern and a light-emitting layer pattern according to an embodiment of the present disclosure.

In some embodiments, when the second pattern portions 91 are the separated patterns, as shown in FIG. 16B, the distribution of the light-emitting portions 3 in the first display region S1 may also be: the first display region S1 includes a third pixel row and a fourth pixel row alternately arranged, and the third pixel row includes a sequentially and periodically arranged blue light-emitting portion 31 that emits blue light, and green light-emitting portions 32 that emits green light; the fourth pixel row includes a red light-emitting portion 33 that emits red light, and a center line z of the red light-emitting portion 33 perpendicular to a pixel row direction is located between a center line x of the green light-emitting portion 32 perpendicular to the pixel row direction and a center line y of the blue light-emitting portion 31 perpendicular to the pixel row direction. A shape of the blue light-emitting portion 31 may be a hexagon, a shape of the green light-emitting portion 32 may be a prism, and a shape of the red light-emitting portion 33 may be a hexagon. A width of the green light-emitting portion 32 in a direction parallel to the pixel row is greater than a width of the blue light-emitting portion 31 in the direction parallel to the pixel row, and the width of the blue light-emitting portion 31 in the direction parallel to the pixel row is greater than a width of the red light-emitting portion 33 in the direction parallel to the pixel row. The second pattern portions 91 may be disposed at a gap between the red light-emitting portions 33 of the fourth pixel row. In this way, the display substrate may have a high transmittance in the first display region S1, which is beneficial for the camera component to obtain light.

During specific implementation, with reference to FIG. 16B, the display substrate may further include a plurality of signal lines 92 (e.g., data lines) extending in a direction same as that of the pixel row. Specifically, the orthographic projections of the second pattern portions 91 on the base substrate 1 do not overlap with orthographic projections of the signal lines 92 on the base substrate 1. Different sub pixels may be electrically connected with the corresponding signal lines 92 by holes.

Figure 13B:
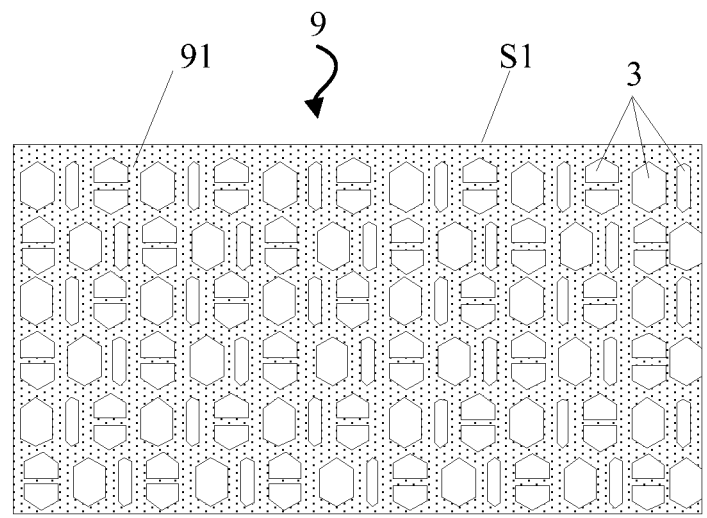
FIG. 13B is a second schematic top view of a pattern of a second inhibitor layer according to an embodiment of the present disclosure.

In some embodiments, the second pattern portions 91 may also be an integrated pattern. As shown in FIG. 13B, the orthographic projections of the second pattern portions 91 on the base substrate are complementary to the orthographic projections of the light-emitting portions 3 on the base substrate 1. Correspondingly, in this case, the second electrode layer 4 is formed in the region where the light-emitting portions 3 are located, and further, in the first display region S1, more regions are covered by the second pattern portions 91 with the high transmittance, and less regions are covered by the second electrode layer 4 with low transmittance, so that the first display region S1 has the high transmittance as a whole, which is beneficial for the camera component disposed in the first display region S1 to obtain the light. Specifically, when the orthographic projections of the second pattern portions 91 on the base substrate are complementary to the orthographic projections of the light-emitting portions 3 on the base substrate 1, the display substrate may further include a connecting line, and the connecting line may connect electrode blocks, corresponding to the different light-emitting portions 3, of the second electrode layer 4. The connecting line may be disposed in the same layer as the second electrode layer 4, or may be disposed with the second electrode layer 4 in different layers, and electrodes at positions of the different light-emitting portions 3 are connected by holes.

In some embodiments, the first transparent inhibitor layer 5 and the second transparent inhibitor layer 9 have the same material, so as to simplify a manufacturing process of the display substrate.

In some embodiments, a thickness of the first transparent inhibitor layer 5 may be 5-15 nm. Specifically, for example, the thickness of the first transparent inhibitor layer 5 may be 10 nm. A thickness of the second transparent inhibitor layer 9 may be 5-15 nm. Specifically, for example, the thickness of the second transparent inhibitor layer 9 may be 10 nm.

In some embodiments, the first transparent inhibitor layer includes one or a combination of the following:
fluorine-containing silane and derivatives;
fatty acid and derivatives;
thiol and derivatives;
sulfide and derivatives;
hydroxyl-group-containing molecules and derivatives; or
phosphate-group-containing molecules and derivatives.

In some embodiments, the first transparent inhibitor layer 5 and the auxiliary electrode layer 6 have different surface energies, so that the auxiliary electrode layer 6 is patterned through the first transparent inhibitor layer 5.

In some embodiments, a transmittance of the first transparent inhibitor layer 5 is higher than a transmittance of the second electrode layer 4. Specifically, the transmittance of the second electrode layer 4 may be 50%-60%, specifically, for example, 55%. The transmittance of the first transparent inhibitor layer 5 may be specifically 95%-99.9%, specifically, for example, 99%.

In some embodiments, a material of the second electrode layer 4 is the same as a material of the auxiliary electrode layer 6. Specifically, the material of the second electrode layer 4 includes: magnesium, silver or magnesium-silver alloy.

In some embodiments, an encapsulation layer is provided on a side of the auxiliary electrode layer 6 facing away from the first transparent inhibitor layer 5.

In some embodiments, there may be a driving layer between the base substrate 1 and the first electrode layer 2. Specifically, the driving layer may be provided with pixel driving circuits, and each pixel driving circuit may specifically include a transistor and a capacitor. For example, each pixel driving circuit may include a 7T1C structure, and the specific pixel driving circuit structure may be the same as the pixel driving circuit in the prior art, which is not repeated in the embodiment of the present disclosure.

Based on the same inventive concept, an embodiment of the present disclosure further provides a display apparatus, including the display substrate provided by the embodiment of the present disclosure.

In some embodiments, the display substrate has a first display region for arranging a camera component, and a second display region other than the first display region; and the display apparatus further includes: a camera component located in the first display region.

Figure 17:
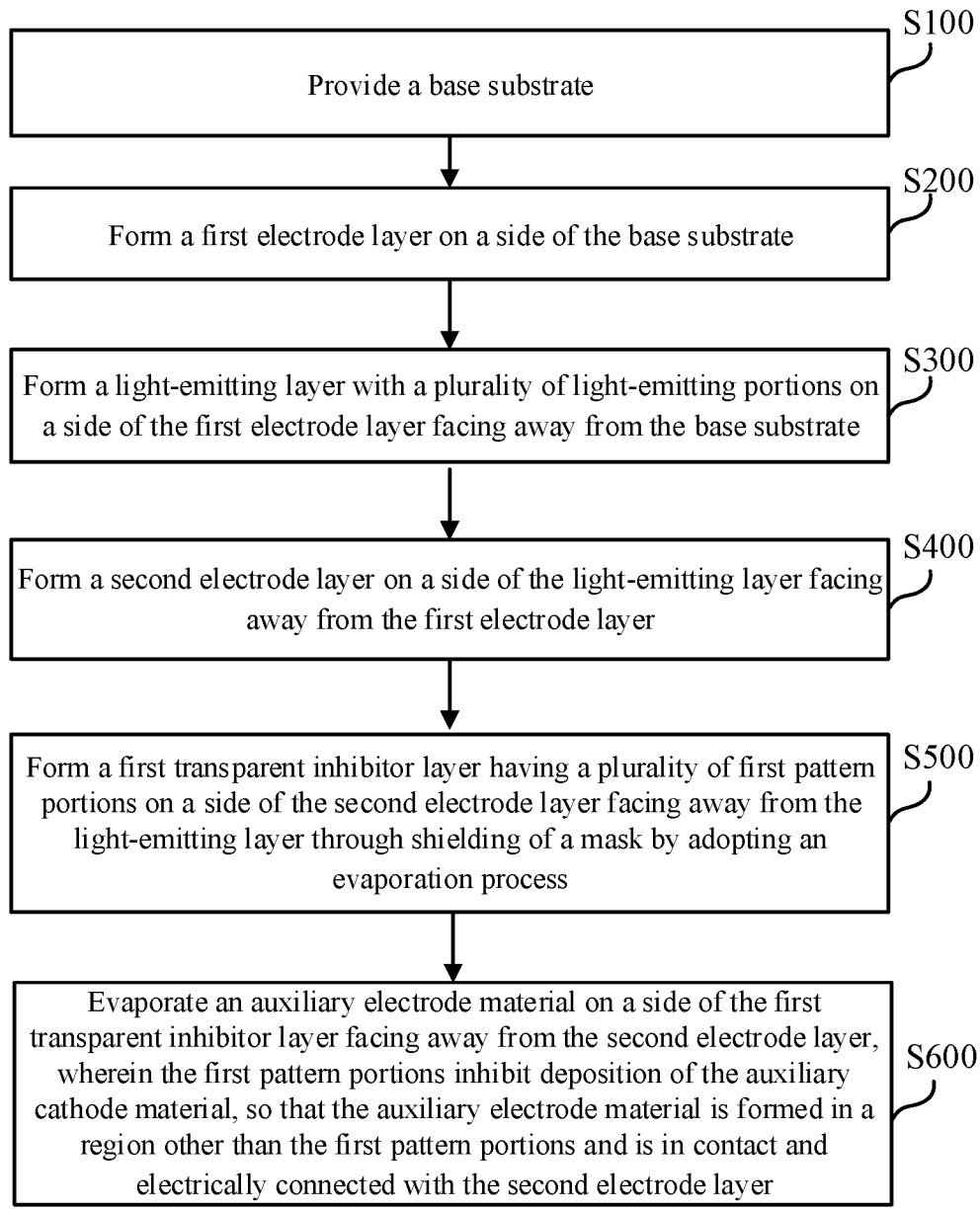
FIG. 17 is a first schematic diagram of a manufacturing flow of a display substrate according to an embodiment of the present disclosure.

Based on the same inventive concept, an embodiment of the present disclosure further provides a manufacturing method of a display substrate, referring to FIG. 17, including:
S100, providing a base substrate;
S200, forming a first electrode layer on a side of the base substrate;
S300, forming a light-emitting layer 3000 with a plurality of light-emitting portions on a side of the first electrode layer facing away from the base substrate;
S400, forming a second electrode layer on a side of the light-emitting layer 3000 facing away from the first electrode layer;
S500, forming a first transparent inhibitor layer having a plurality of mutually separated first pattern portions on a side of the second electrode layer facing away from the light-emitting layer 3000 through shielding of a mask by adopting an evaporation process; and
S600, evaporating an auxiliary electrode material on a side of the first transparent inhibitor layer facing away from the second electrode layer, wherein auxiliary cathode material is prevented from forming on the first pattern portions, so that the auxiliary electrode material is formed in a region other than the first pattern portions and is in contact and electrically connected with the second electrode layer.

In the embodiment of the present disclosure, the first transparent inhibitor layer is disposed on a side of the second electrode layer facing away from the light-emitting layer 3000, and the first transparent inhibitor layer has the plurality of first pattern portions. Due to an inhibitory effect of the first transparent inhibitor layer, formation of the auxiliary electrode layer may be inhibited in a region where the first pattern portions are formed, so that the auxiliary electrode layer covers the region other than the first pattern portions and is in contact and electrically connected with the second electrode layer at the region other than the first pattern portions to realize manufacturing of a patterned auxiliary electrode layer, which improves a problem of uneven brightness of the display substrate caused by IR drop. Moreover, compared with the prior art, when a patterned auxiliary electrode layer is formed, the embodiment of the present disclosure does not need etching and other processes, the auxiliary electrode layer is not prone to being oxidized, which can reduce the cost for better protection of a backplane, and there will be no organic residues such as photoresist, so that a problem of poor contact between the second electrode layer and the auxiliary electrode layer due to the presence of pollutants may be improved.

The first pattern portions may be formed respectively by adopting two masks or formed once by adopting one mask. The detailed description is made as follows.

Figure 18A:
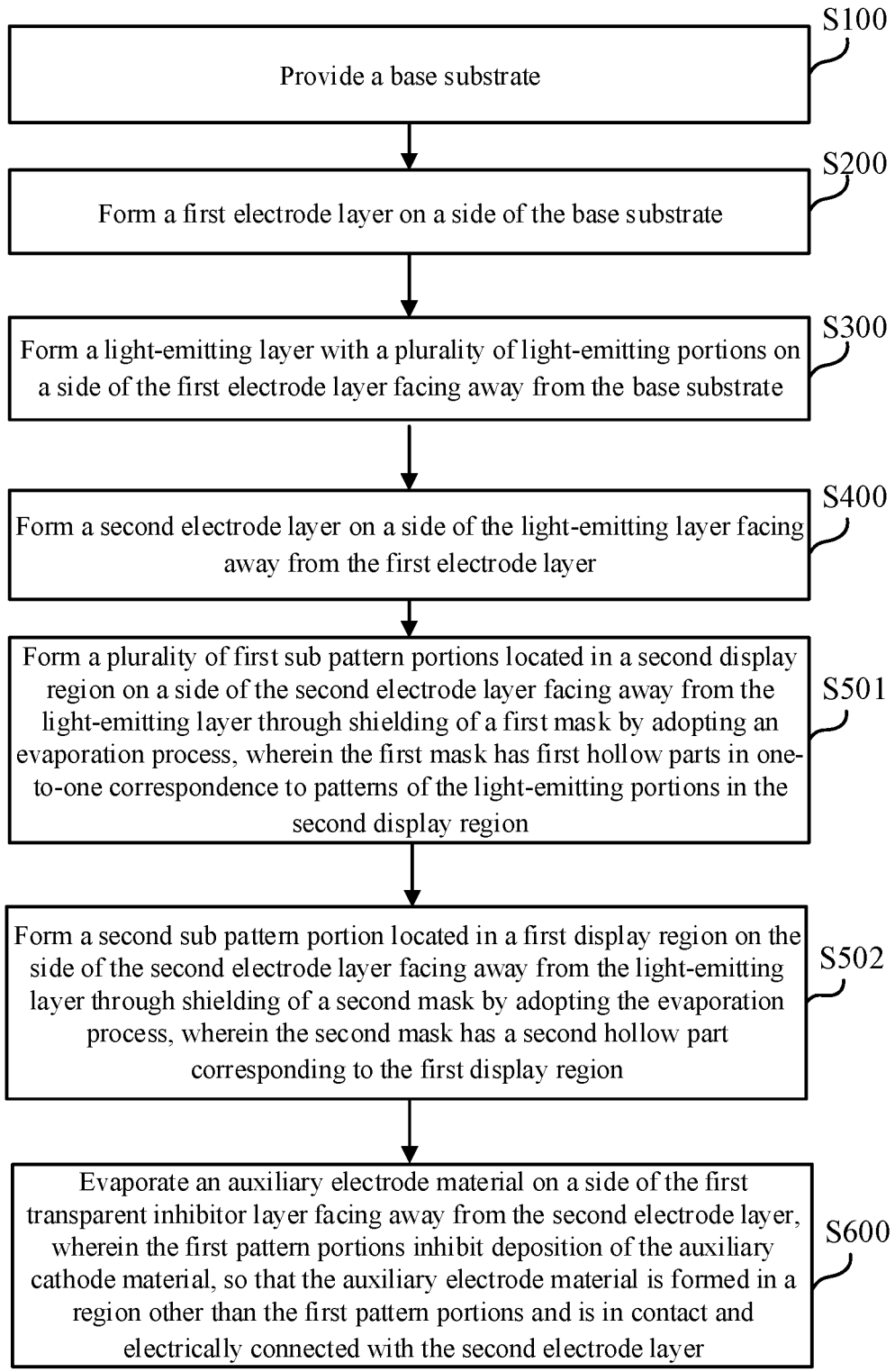
FIG. 18A is a second schematic diagram of a manufacturing method of a display substrate according to an embodiment of the present disclosure.
Figure 18B:
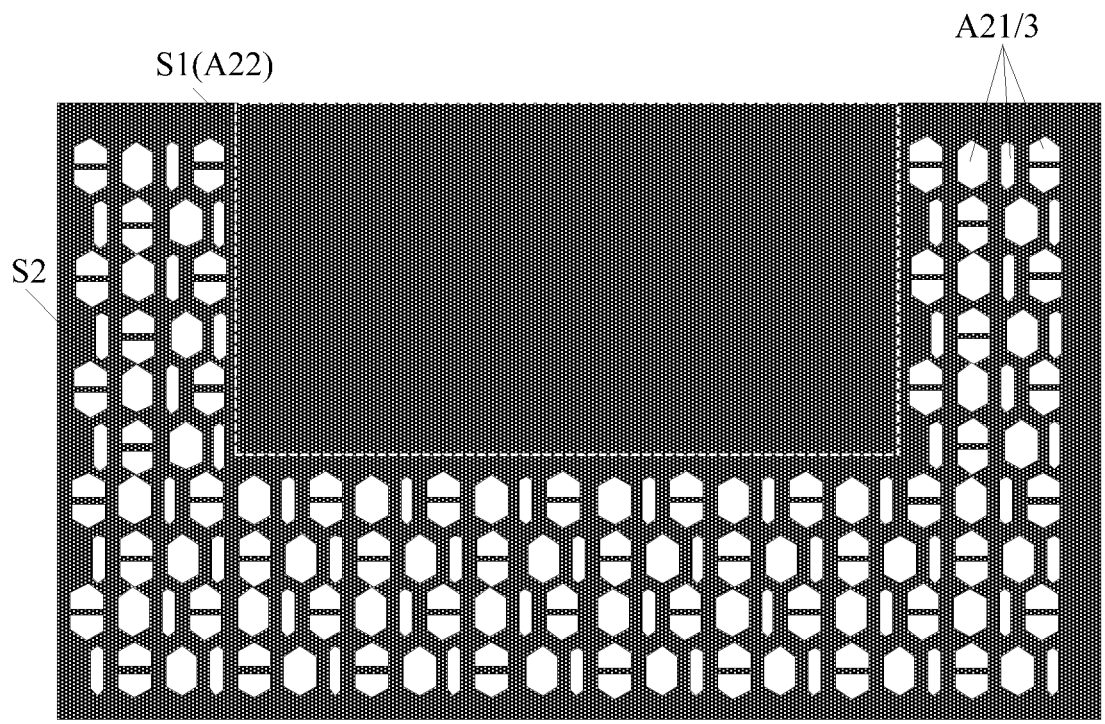
FIG. 18B is a schematic diagram of a first mask according to an embodiment of the present disclosure.
Figure 18C:
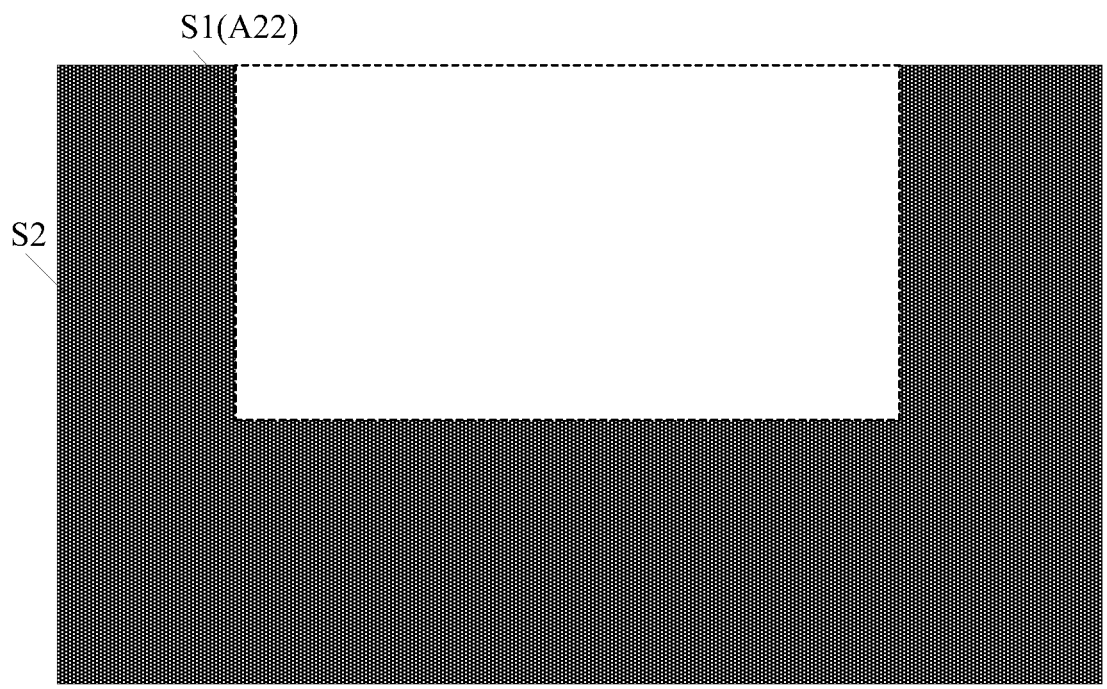
FIG. 18C is a schematic diagram of a second mask according to an embodiment of the present disclosure.

In some embodiments, the two masks are adopted to form the first pattern portions respectively, and the display substrate has a first display region for arranging a camera component, and a second display region other than the first display region. With reference to FIG. 18A, in S500, the evaporating and forming the first transparent inhibitor layer having the plurality of first pattern portions on the side of the second electrode layer facing away from the light-emitting layer 3000 through shielding of the mask by adopting the evaporation process, may include:

S501, forming a plurality of first sub pattern portions located in the second display region on the side of the second electrode layer facing away from the light-emitting layer 3000 through shielding of a first mask by adopting the evaporation process, wherein the first mask has first hollow parts A21 in one-to-one correspondence to patterns of the light-emitting portions 511 in the second display region S2, as shown in FIG. 18B; and S502, forming a second sub pattern portion located in the first display region on a side of the second electrode layer facing away from the light-emitting layer 3000 through shielding of a second mask by adopting the evaporation process, wherein the second mask has a second hollow part A22 corresponding to the first display region S1, as shown in FIG. 18C.

During specific implementation, the first sub pattern portions may be formed first in S501, and then the second sub pattern portion may be formed in S502; or the second sub pattern portion may be formed first in S502, and then the first sub pattern portions may be formed in S501.

Figure 19A:
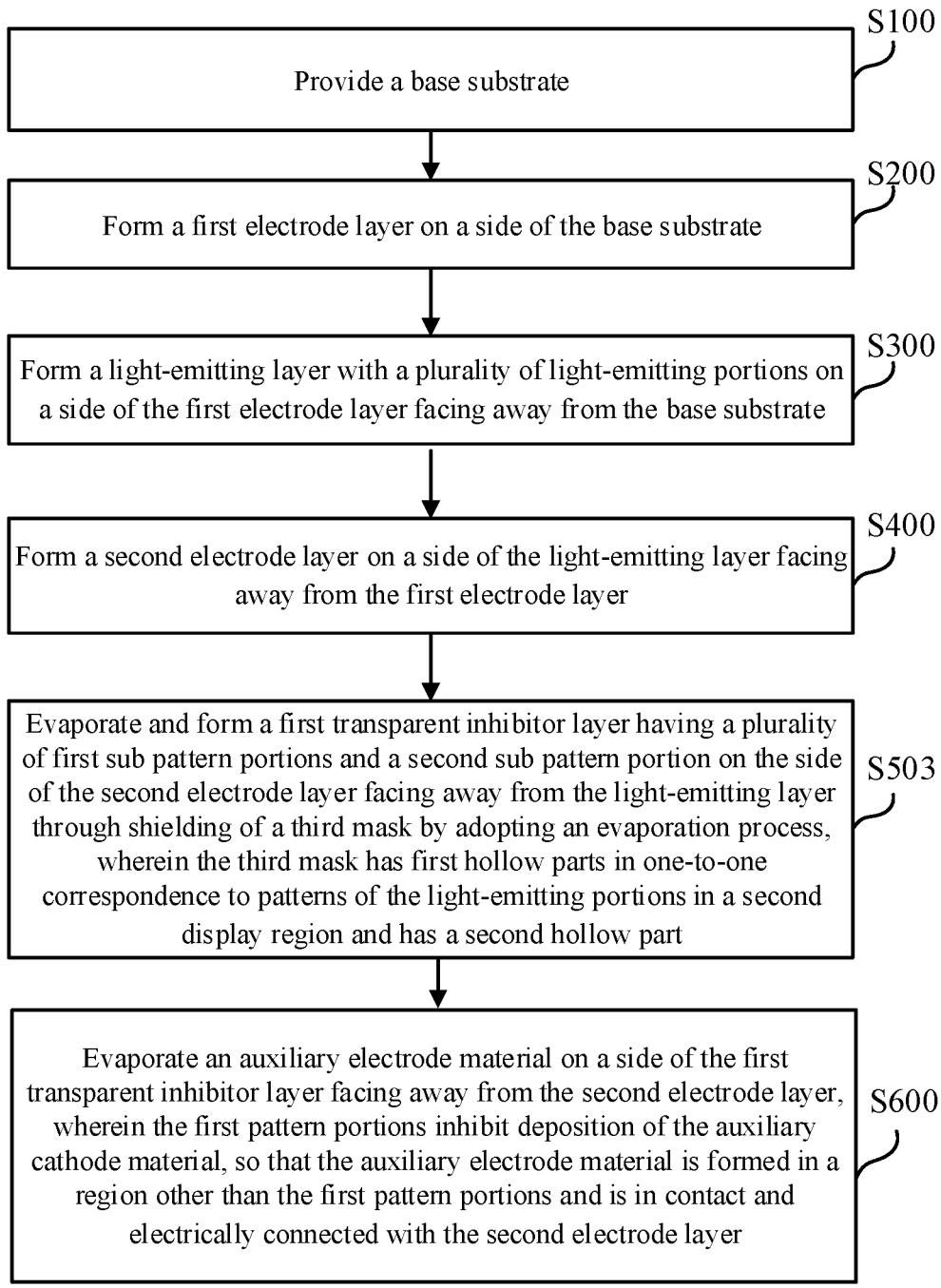
FIG. 19A is a third schematic diagram of a manufacturing method of a display substrate according to an embodiment of the present disclosure.
Figure 19B:
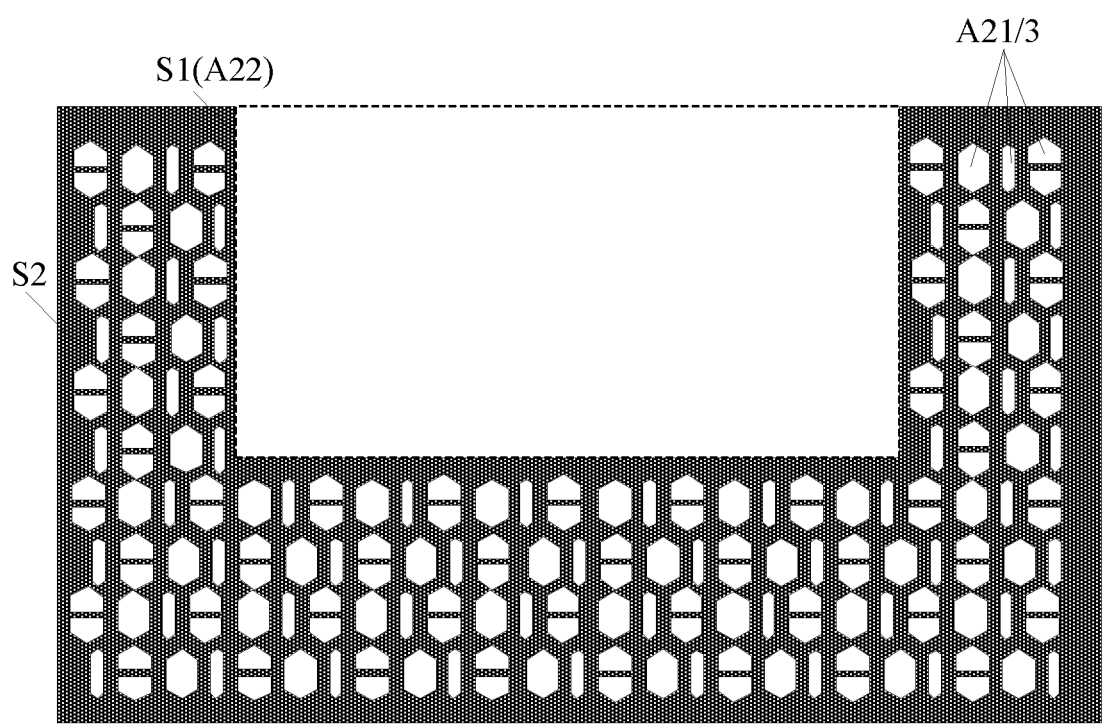
FIG. 19B is a schematic diagram of a third mask according to an embodiment of the present disclosure.

In some embodiments, one mask is adopted to form the first pattern portions. The display substrate has the first display region for arranging the camera component, and the second display region other than the first display region. With reference to FIG. 19A, in S500, the evaporating and forming the first transparent inhibitor layer having the plurality of first pattern portions on the side of the second electrode layer facing away from the light-emitting layer 3000 through shielding of the mask by adopting the evaporation process, may include:

S503, evaporating and forming a first transparent inhibitor layer having a plurality of first sub pattern portions and a second sub pattern portion on a side of the second electrode layer facing away from the light-emitting layer 3000 through shielding of a third mask by adopting the evaporation process, wherein the third mask has first hollow parts A21 in one-to-one correspondence to patterns of the light-emitting portions 3 in the second display region S2 and has a second hollow part A22 corresponding to the first display region S1, as shown in FIG. 19B.

Figure 20:
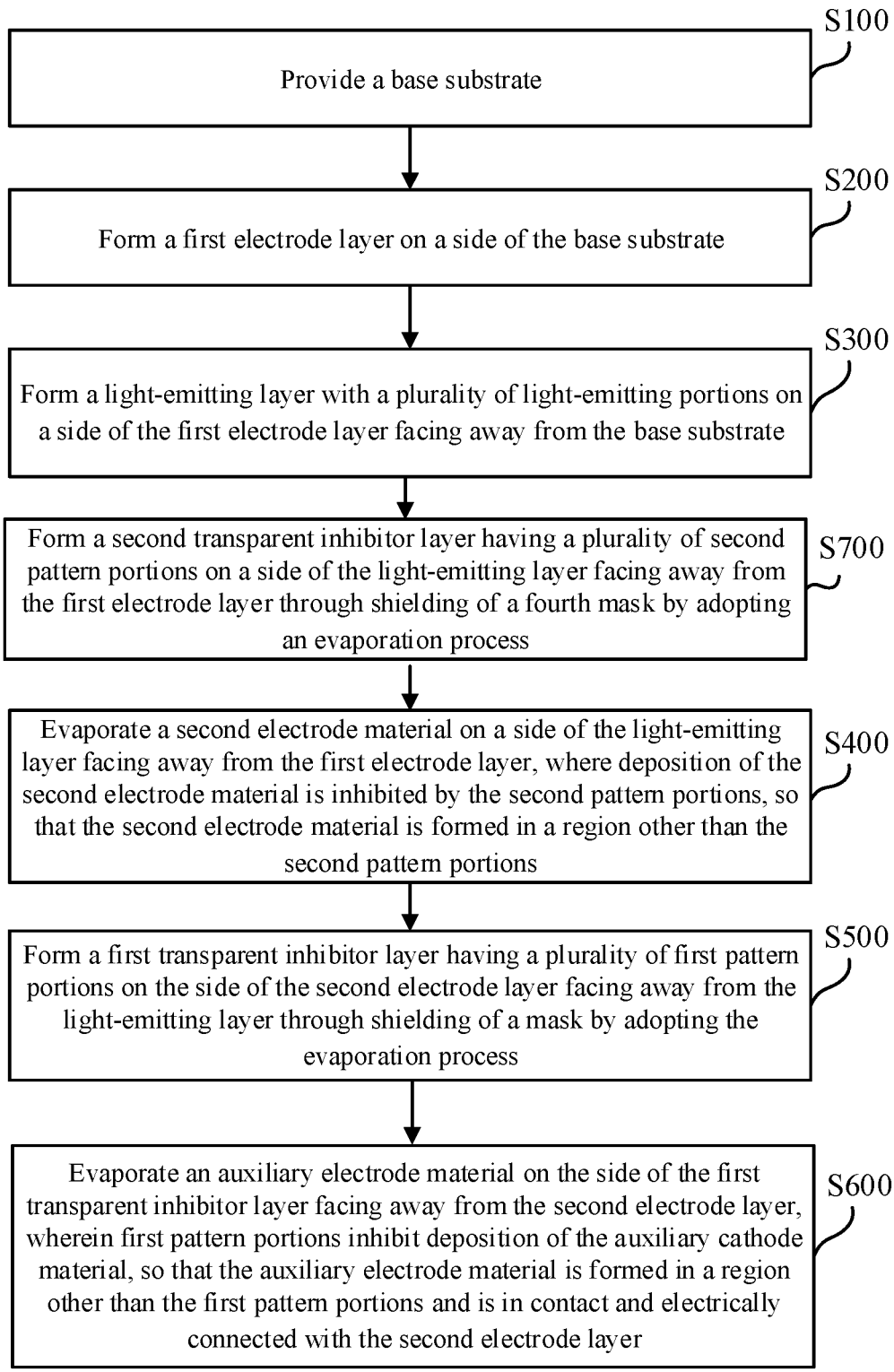
FIG. 20 is a fourth schematic diagram of a manufacturing method of a display substrate according to an embodiment of the present disclosure.
Figure 21:
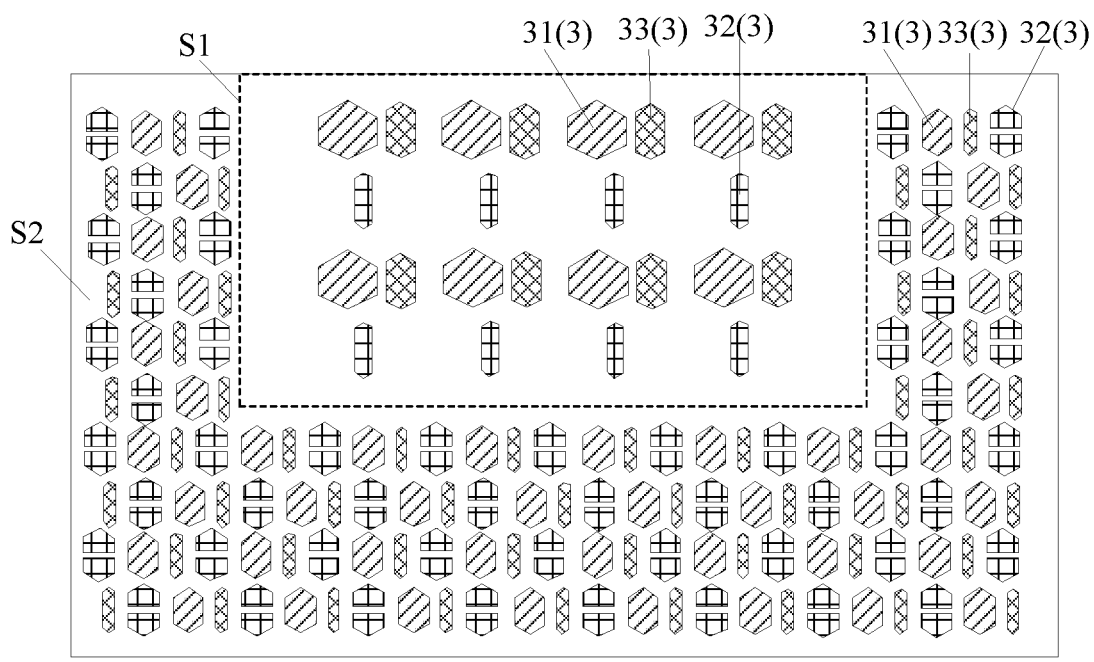
FIG. 21 is a schematic top view of a structure with an electron transport layer formed according to an embodiment of the present disclosure.
Figure 22:
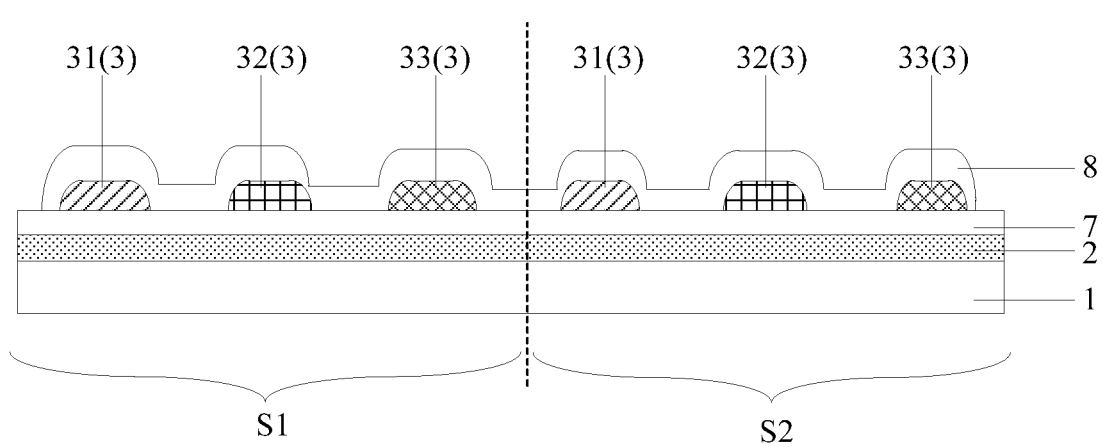
FIG. 22 is a schematic sectional view of a structure with an electron transport layer formed according to an embodiment of the present disclosure.

In some embodiments, after S300 and before S400, that is, after forming the light-emitting layer 3000 on the side of the first electrode layer facing away from the base substrate, and before forming the second electrode layer on the side of the light-emitting layer 3000 facing away from the first electrode layer, with reference to FIG. 20, the manufacturing method further includes: S700, forming a second transparent inhibitor layer having a plurality of second pattern portions on the side of the light-emitting layer 3000 facing away from the first electrode layer through shielding of a fourth mask by adopting the evaporation process.

Correspondingly, in S400, the forming the second electrode layer on the side of the light-emitting layer 3000 facing away from the first electrode layer includes: evaporating a second electrode material on the side of the light-emitting layer 3000 facing away from the first electrode layer, where deposition of the second electrode material is inhibited by the second pattern portions, so that the second electrode material is formed in a region other than the second pattern portions.

In order to more clearly understand the manufacturing method of the display substrate provided by the embodiment of the present invention, taking the display substrate having the first transparent inhibitor layer and the second transparent inhibitor layer as an example, with reference to FIGS. 21-30, further detailed descriptions are made as follows.

Step 1: a backplane containing a transistor and the first electrode layer 2 is formed, and a hole transport layer 7, a blue light-emitting portion 31/green light-emitting portion 32/red light-emitting portion 33, and an electron transport layer 8 are sequentially evaporated. Here the second display region S2 is of a normal 7T1C structure. In order to improve the transmittance of the first display region S1 (under-screen camera region), the design of the blue light-emitting portion 31/green light-emitting portion 32/red light-emitting portion 33 can be changed, as shown in the FIG. 21 and FIG. 22.

Figure 23:
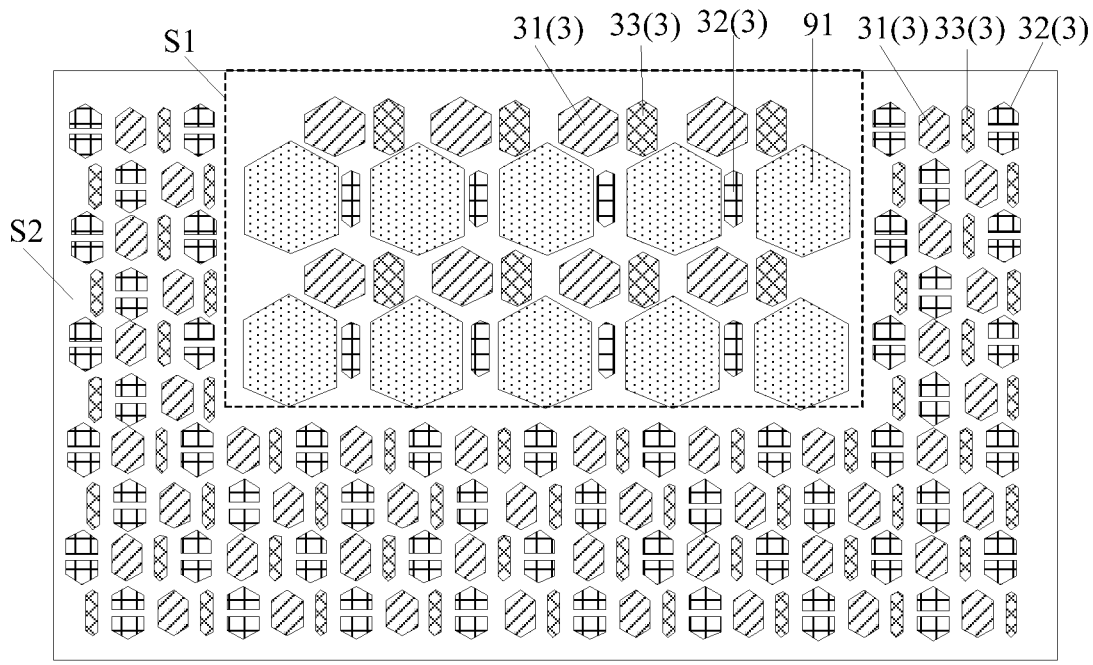
FIG. 23 is a schematic top view of a structure with a second inhibitor layer formed according to an embodiment of the present disclosure.
Figure 24:
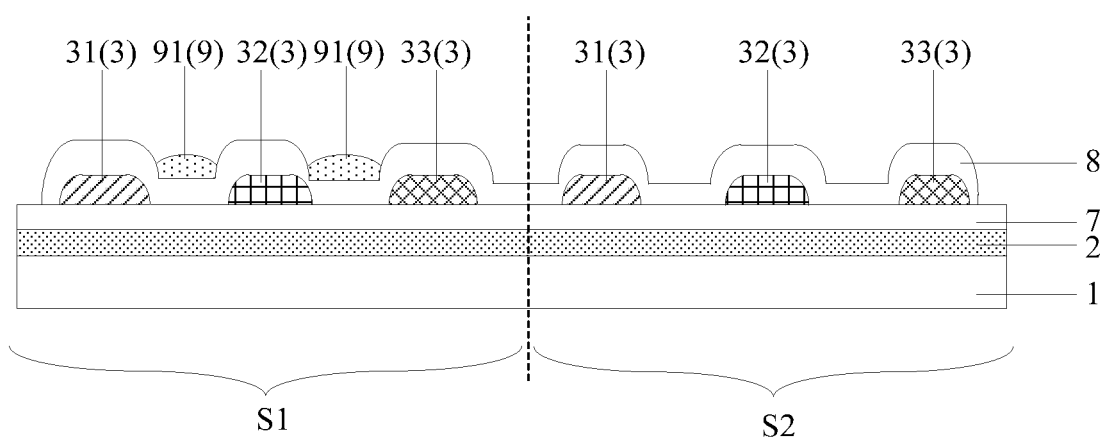
FIG. 24 is a schematic sectional view of a structure with a second inhibitor layer formed according to an embodiment of the present disclosure.

Step 2: a second transparent inhibitor material (to realize weak bonding with the subsequently formed second electrode layer 4) is evaporated on the first display region S1 (pattern cathode region) to form the second transparent inhibitor layer 9 with the plurality of second pattern portions 91, as shown in FIG. 23 and FIG. 24.

Figure 25:
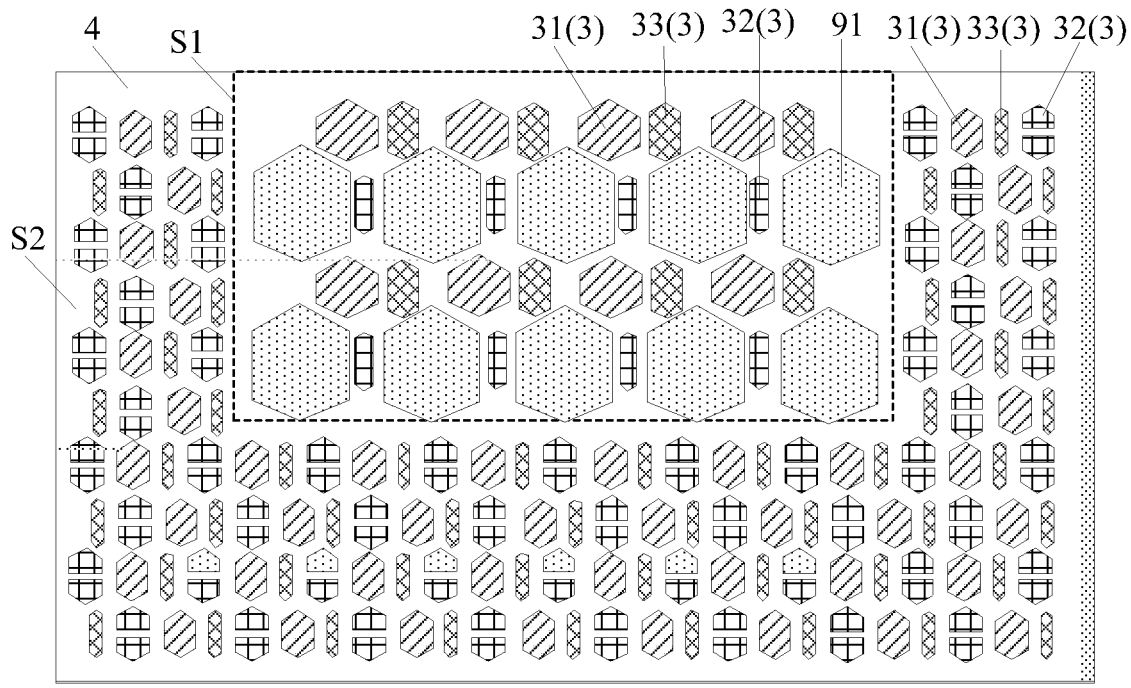
FIG. 25 is a schematic top view of a structure with a second electrode layer formed according to an embodiment of the present disclosure.
Figure 26:
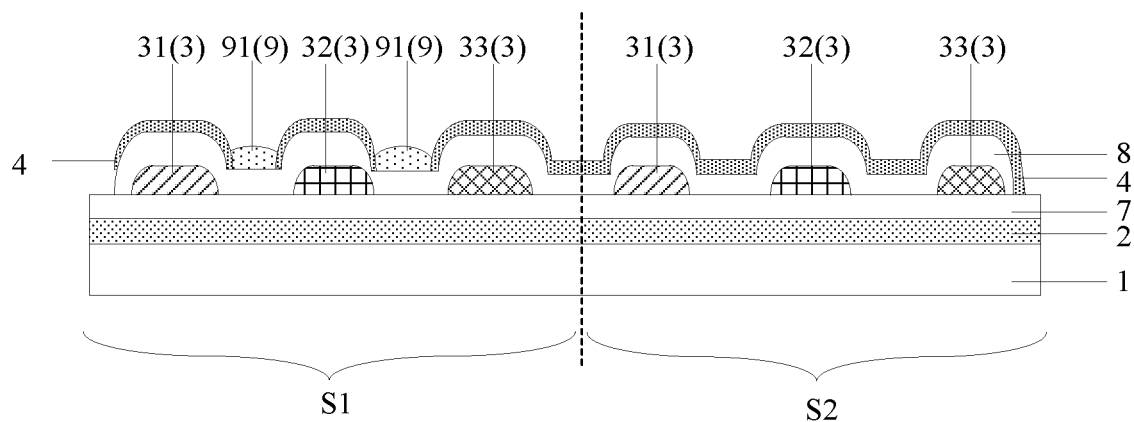
FIG. 26 is a schematic sectional view of a structure with a second electrode layer formed according to an embodiment of the present disclosure.

Step 3: a second electrode layer 4 of about 10 nm-14 nm (surface resistance Rs=12-18Ω/□) is evaporated in the second display region S2 (auxiliary cathode region) and the first display region S1 (pattern cathode region). Since the second transparent inhibitor layer 9 has an inhibitory effect on the deposition of the second electrode material, the second electrode layer 4 cannot be deposited on the part with the second pattern portions 91, as shown in FIG. 25 and FIG. 26.

Figure 27:
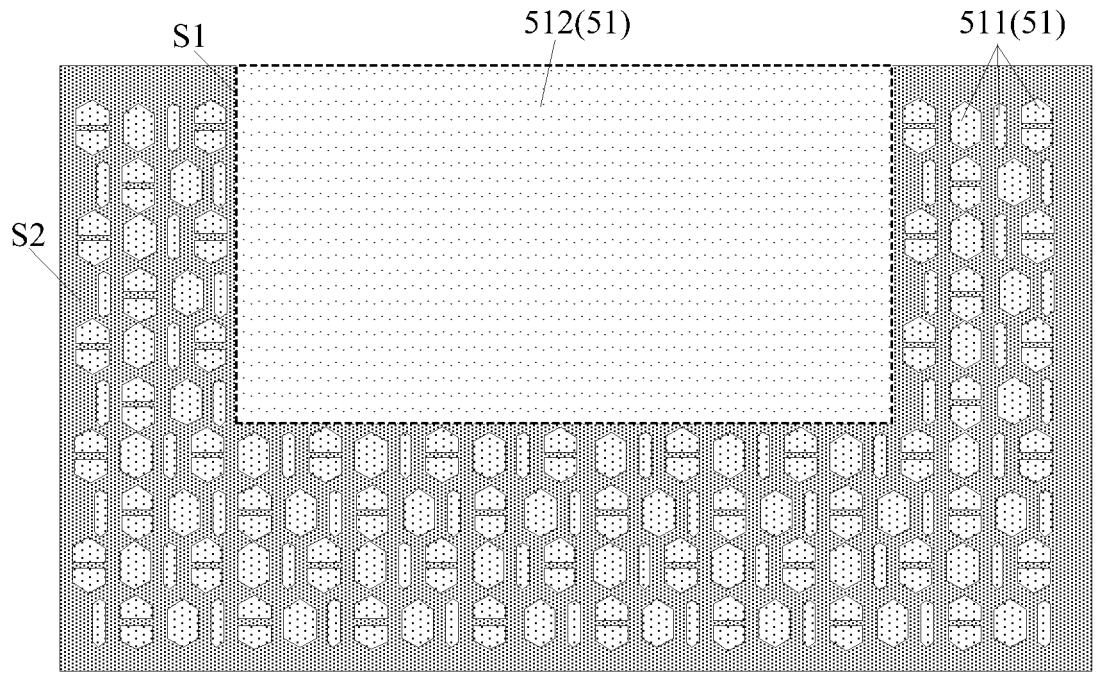
FIG. 27 is a schematic top view of a structure with a first inhibitor layer formed according to an embodiment of the present disclosure.
Figure 28:
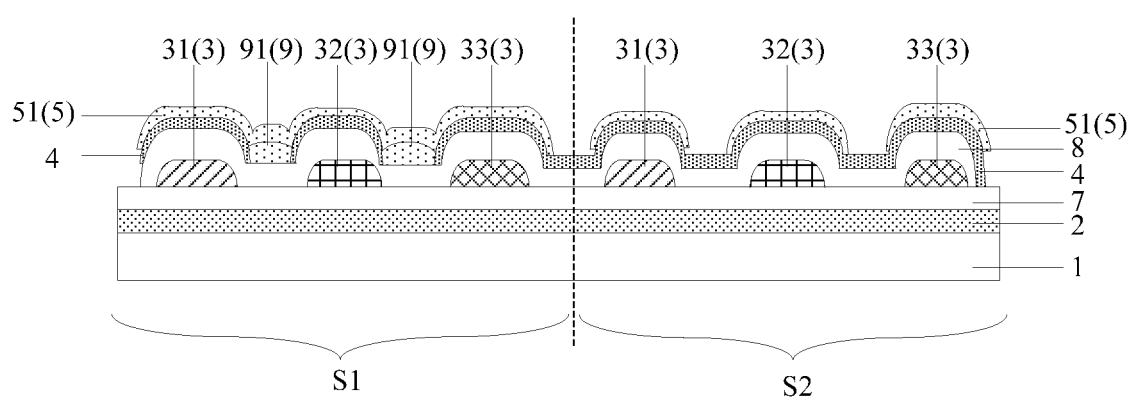
FIG. 28 is a schematic sectional view of a structure with a first inhibitor layer formed according to an embodiment of the present disclosure.

Step 4: the first transparent inhibitor layer 5 including the first sub pattern portions 511 and the second sub pattern portion 512 is evaporated, and contains R, G, B pixel regions in the entire first display region S1 (pattern cathode region) and the second display region S2 (auxiliary cathode region), as shown in FIG. 27 and FIG. 28.

Figure 29:
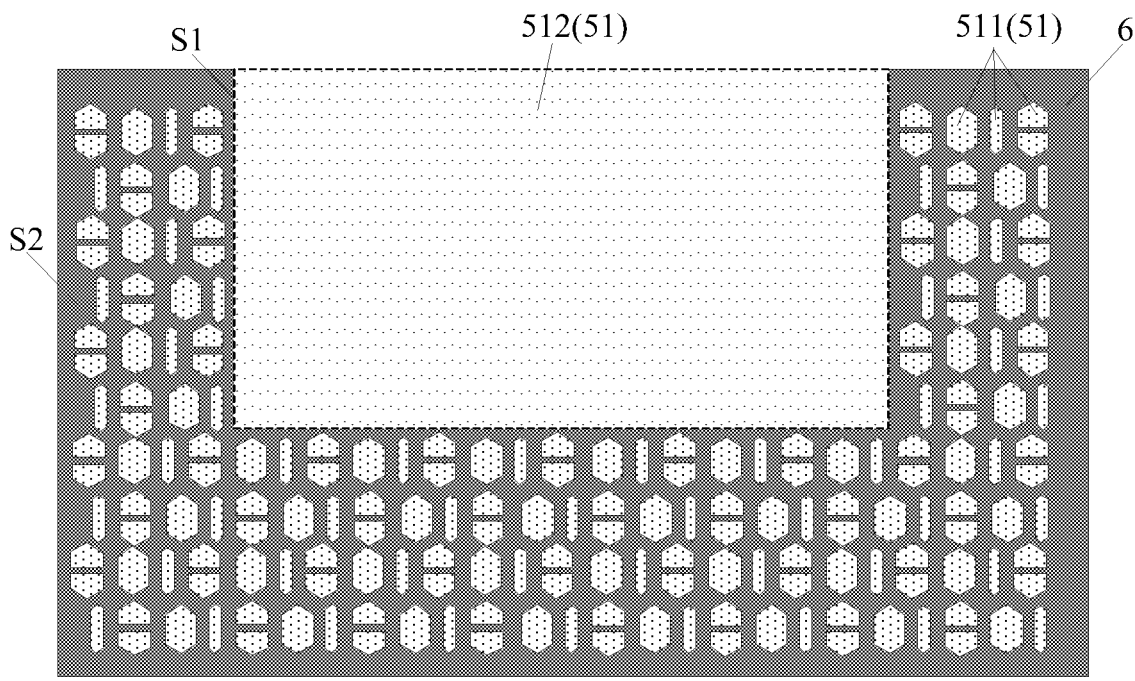
FIG. 29 is a schematic top view of a structure with an auxiliary electrode layer formed according to an embodiment of the present disclosure.
Figure 30:
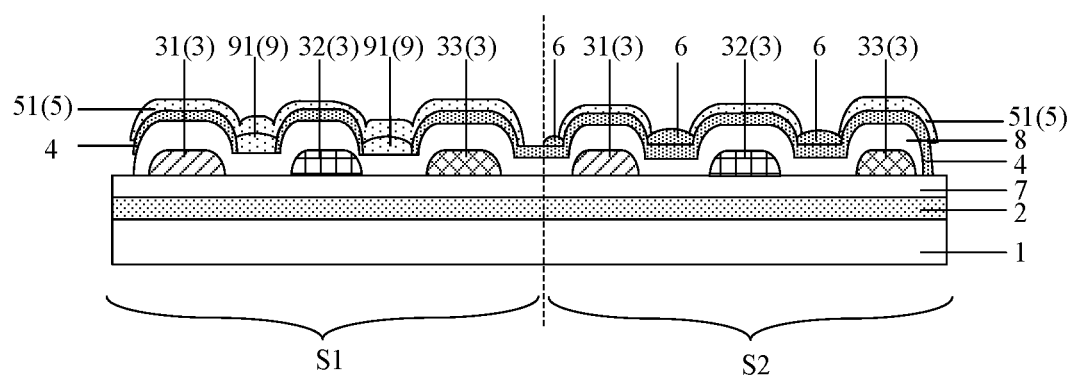
FIG. 30 is a schematic sectional view of a structure with an auxiliary electrode layer formed according to an embodiment of the present disclosure.

Step 5: the auxiliary electrode layer 6 with a thickness of 10 nm-20 nm is evaporated, so that sheet resistance of the entire second display region S2 (auxiliary cathode region) may reach 3Ω/□-8Ω/□. Because the first transparent inhibitor layer 5 has the inhibitory effect on the deposition of the auxiliary electrode material, the auxiliary electrode material cannot be deposited in the part with the first sub pattern portions 511 and the second sub pattern portion 512, as shown in FIG. 29 and FIG. 30. The encapsulation layer and a light extraction layer (the specific material may be LiF) are evaporated after the auxiliary electrode material is evaporated.

Although the preferred embodiments of the present invention have been described, those skilled in the art can make additional modifications and variations on these embodiments once they know the basic creative concept. Therefore, the appended claim intends to be explained as including the preferred embodiments and all modifications and variations falling within the scope of the present invention.

Obviously, those skilled in the art can make various modifications and variations to the embodiment of the present invention without departing from the spirit and scope of the embodiment of the present invention. In this way, if these modifications and variations of the embodiment of the present invention fall within the scope of the claims of the present invention and their equivalent art, the present invention also intends to include these modifications and variations.

What is claimed is:

1. A display substrate, comprising:
   a base substrate;
   a first electrode layer, disposed on a side of the base substrate;
   a light-emitting layer, disposed on a side of the first electrode layer facing away from the base substrate, and comprising a plurality of light-emitting portions;
   a second electrode layer, disposed on a side of the light-emitting layer facing away from the first electrode layer;
   a first transparent inhibitor layer, disposed on a side of the second electrode layer facing away from the light-emitting layer, and comprising a plurality of first pattern portions separate from each other; and
   an auxiliary electrode layer, disposed on a side of the first transparent inhibitor layer facing away from the second electrode layer, wherein the auxiliary electrode layer comprises an auxiliary electrode pattern formed by inhibition of the first pattern portions, at least part of an orthographic projection of the auxiliary electrode pattern on the base substrate does not overlap with orthographic projections of the first pattern portions on the base substrate, and the auxiliary electrode pattern is in contact and electrically connected with the second electrode layer.

2. The display substrate according to claim 1, wherein the display substrate has a first display region for arranging a camera component, and a second display region other than the first display region; and
   the first pattern portions comprise a plurality of first sub pattern portions located in the second display region, and an orthographic projection of a first sub pattern portion on the base substrate corresponds to in one-to-one correspondence and at least partially overlaps with an orthographic projection of a light-emitting portion in the second display region on the base substrate.

3. The display substrate according to claim 2, wherein the first pattern portions further comprise a second sub pattern portion, and an orthographic projection of the second sub pattern portion on the base substrate and an orthographic projection of the first display region on the base substrate substantially overlap.

4. The display substrate according to claim 2, further comprising a second transparent inhibitor layer between the light-emitting layer and the second electrode layer, wherein the second transparent inhibitor layer comprises second pattern portions located in the first display region; and
   the second electrode layer covers the second display region and covers a region of the first display region other than the second pattern portions.

5. The display substrate according to claim 4, wherein an orthographic projection of each second pattern portion on the base substrate is located at a gap between orthographic projections of adjacent light-emitting portions in the first display region on the base substrate.

6. The display substrate according to claim 5, wherein the second pattern portions are of an integrated connection pattern, and orthographic projections of the second pattern portions on the base substrate are complementary to the orthographic projections of the light-emitting portions on the base substrate.

7. The display substrate according to claim 5, wherein
   a distribution of the light-emitting portions in the first display region and a distribution of the light-emitting portions in the second display region are same; and
   the second pattern portions are of a separately-distributed pattern, and located in gaps between adjacent pixel rows.

8. The display substrate according to claim 7, wherein a shape of the second pattern portion is a circle or a hexagon.

9. The display substrate according to claim 5, wherein
   a distribution density of the light-emitting portions in the first display region is smaller than a distribution density of the light-emitting portions in the second display region; and
   the first display region comprises:
     a first pixel row and a second pixel row arranged alternately, the first pixel row comprises a blue light-emitting portion that emits blue light and a red light-emitting portion that emits red light, the second pixel row comprises a green light-emitting portion that emits green light; and
     a center line of the green light-emitting portion perpendicular to a pixel row direction is located between a center line of the blue light-emitting portion perpendicular to the pixel row direction and a center line of the red light-emitting portion perpendicular to the pixel row direction; and
   the second pattern portions are of a separately-distributed pattern, and are located at gaps between adjacent green light-emitting portions of the second pixel row.

10. The display substrate according to claim 5, wherein
    a distribution density of the light-emitting portions in the first display region is smaller than a distribution density of the light-emitting portions in the second display region; and
    the first display region comprises:
      a third pixel row and a fourth pixel row arranged alternately, the third pixel row comprises a blue light-emitting portion that emits blue light and a green light-emitting portion that emits green light, the fourth pixel row comprises a red light-emitting portion that emits red light; and
      a center line of the red light-emitting portion perpendicular to a pixel row direction is located between a center line of the blue light-emitting portion perpendicular to the pixel row direction and a center line of the green light-emitting portion perpendicular to the pixel row direction; and
    the second pattern portions are of a separately-distributed pattern, and located at gaps between adjacent red light-emitting portions of the fourth pixel row.

11. The display substrate according to claim 4, wherein the first transparent inhibitor layer and the second transparent inhibitor layer are made of a same material.

12. The display substrate according to claim 11, wherein the first transparent inhibitor layer comprises one or a combination of following:
    fluorine-containing silane and derivatives;
    fatty acid and derivatives;
    thiol and derivatives;
    sulfide and derivatives;
    hydroxyl-group-containing molecules and derivatives; or
    phosphate-group-containing molecules and derivatives.

13. The display substrate according to claim 11, wherein the first transparent inhibitor layer and the auxiliary electrode layer have different surface energies.

14. The display substrate according to claim 11, wherein a transmittance of the first transparent inhibitor layer is higher than a transmittance of the second electrode layer.

15. The display substrate according to claim 14, wherein
- a material of the second electrode layer is same as a material of the auxiliary electrode layer; and
- the material of the second electrode layer comprises: magnesium, silver or magnesium-silver alloy.

16. A manufacturing method of the display substrate according to claim 1, comprising:
- providing a base substrate;
- forming a first electrode layer on a side of the base substrate;
- forming a light-emitting layer with a plurality of light-emitting portions on a side of the first electrode layer facing away from the base substrate;
- forming a second electrode layer on a side of the light-emitting layer facing away from the first electrode layer;
- forming a first transparent inhibitor layer having a plurality of mutually separated first pattern portions on a side of the second electrode layer facing away from the light-emitting layer through shielding of a mask by adopting an evaporation process; and
- evaporating an auxiliary electrode material on a side of the first transparent inhibitor layer facing away from the second electrode layer, wherein the first pattern portions inhibit deposition of the auxiliary cathode material, so that the auxiliary electrode material is formed in a region other than the first pattern portions and is in contact and electrically connected with the second electrode layer.

17. The manufacturing method according to claim 16, wherein the display substrate has a first display region for arranging a camera component, and a second display region other than the first display region; and
- the evaporating and forming the first transparent inhibitor layer having the plurality of first pattern portions on the side of the second electrode layer facing away from the light-emitting layer through shielding of the mask by adopting the evaporation process, comprises one of following processes:
    - process 1:
        - forming a plurality of first sub pattern portions in the second display region on the side of the second electrode layer facing away from the light-emitting layer through shielding of a first mask by adopting the evaporation process, wherein the first mask has first hollow parts in one-to-one correspondence to patterns of the light-emitting portions in the second display region; and
        - forming a second sub pattern portion located in the first display region on the side of the second electrode layer facing away from the light-emitting layer through shielding of a second mask by adopting the evaporation process, wherein the second mask has a second hollow part corresponding to the first display region;
    - or process 2:
        - evaporating and forming a first transparent inhibitor layer having a plurality of first sub pattern portions and a second sub pattern portion on the side of the second electrode layer facing away from the light-emitting layer through shielding of a third mask by adopting the evaporation process, wherein the third mask has first hollow parts in one-to-one correspondence to patterns of the light-emitting portions in the second display region and has a second hollow part corresponding to the first display region.

18. The manufacturing method according to claim 16, wherein after forming the light-emitting layer on the side of the first electrode layer facing away from the base substrate, and before forming the second electrode layer on the side of the light-emitting layer facing away from the first electrode layer, the manufacturing method further comprises:
- forming a second transparent inhibitor layer having a plurality of second pattern portions on the side of the light-emitting layer facing away from the first electrode layer through shielding of a fourth mask by adopting the evaporation process; and
- the forming the second electrode layer on the side of the light-emitting layer facing away from the first electrode layer comprises:
    - evaporating a second electrode material on the side of the light-emitting layer facing away from the first electrode layer, wherein deposition of the second electrode material is inhibited by the second pattern portions, so that the second electrode material is formed in a region other than the second pattern portions.

19. A display apparatus, comprising a display substrate comprising:
- a base substrate;
- a first electrode layer, disposed on a side of the base substrate;
- a light-emitting layer, disposed on a side of the first electrode layer facing away from the base substrate, and comprising a plurality of light-emitting portions;
- a second electrode layer, disposed on a side of the light-emitting layer facing away from the first electrode layer;
- a first transparent inhibitor layer, disposed on a side of the second electrode layer facing away from the light-emitting layer, and comprising a plurality of first pattern portions separate from each other; and
- an auxiliary electrode layer, disposed on a side of the first transparent inhibitor layer facing away from the second electrode layer, wherein the auxiliary electrode layer comprises an auxiliary electrode pattern formed by inhibition of the first pattern portions, at least part of an orthographic projection of the auxiliary electrode pattern on the base substrate does not overlap with orthographic projections of the first pattern portions on the base substrate, and the auxiliary electrode pattern is in contact and electrically connected with the second electrode layer.

20. The display apparatus according to claim 19, wherein the display substrate has a first display region for arranging a camera component, and a second display region other than the first display region; and
- the display apparatus further comprises: a camera component located in the first display region.

* * * * *